US008716808B2

(12) United States Patent
Deng et al.

(10) Patent No.: US 8,716,808 B2
(45) Date of Patent: May 6, 2014

(54) STATIC RANDOM-ACCESS MEMORY CELL ARRAY WITH DEEP WELL REGIONS

(71) Applicant: Texas Instruments Incorporated, Dallas, TX (US)

(72) Inventors: Xiaowei Deng, Plano, TX (US); Wah Kit Loh, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/861,585

(22) Filed: Apr. 12, 2013

(65) Prior Publication Data

US 2013/0320458 A1    Dec. 5, 2013

Related U.S. Application Data

(60) Provisional application No. 61/655,545, filed on Jun. 5, 2012.

(51) Int. Cl.
*H01L 27/092*    (2006.01)

(52) U.S. Cl.
USPC ............... 257/371; 257/390; 257/E27.098

(58) Field of Classification Search
USPC ................... 257/371, 390, E27.098
See application file for complete search history.

(56) References Cited

U.S. PATENT DOCUMENTS 4,984,196 A * 1/1991 Tran et al. ............... 365/51
8,472,251 B2 * 6/2013 Lee et al. ............. 365/185.1

2012/0106225 A1   5/2012 Deng et al.
2013/0182495 A1 * 7/2013 Deng ........................ 365/156
2013/0219200 A1 * 8/2013 Jain et al. ................. 713/323

OTHER PUBLICATIONS

Boselli et al., "Latch-up in 65nm CMOS Technology: A Scaling Perspective", 43rd Annual International Reliability Physics Symposium (IEEE, 2005), pp. 137-144.
U.S. Appl. No. 13/558,003, filed Jul. 25, 2012, entitled "Efficient Static-Random Access Memory Layout".
Gasiot et al., "Multiple Cell Upsets as the Key Contribution to the Total SER of 65 nm CMOS SRAMs and Its Dependence on Well Engineering", Trans. Nuclear Sci., vol. 54, No. 6 (IEEE, 2007).
Rennie et al., "Design Challenges in Nanometric Embedded Memories", Int. Conf. on Signals, Circuits and Systems (IEEE, 2009).
Roche et al., "A Commercial 65nm CMOS Technology for Space Applications: Heavy Ion, Proton and Gamma Test Results and Modeling", 2009 European Conference on Radiation and Its Effects on Components and Systems (IEEE, 2009), pp. 456-464.

* cited by examiner

*Primary Examiner* — Trung Q Dang
(74) *Attorney, Agent, or Firm* — Rose Alyssa Keagy; Wade J. Brady, III; Frederick J. Telecky, Jr.

(57) ABSTRACT

An integrated circuit including a complementary metal-oxide-semiconductor (CMOS) static random access memory (SRAM) with periodic deep well structures within the memory cell array. The deep well structures are contacted by surface well regions of the same conductivity type (e.g., n-type) in the memory cell array, forming two-dimensional grids of both n-type and p-type semiconductor material in the memory cell array area. Bias conductors may contact the grids to apply the desired well bias voltages, for example in well-tie regions or peripheral circuitry adjacent to the memory cell array.

14 Claims, 15 Drawing Sheets

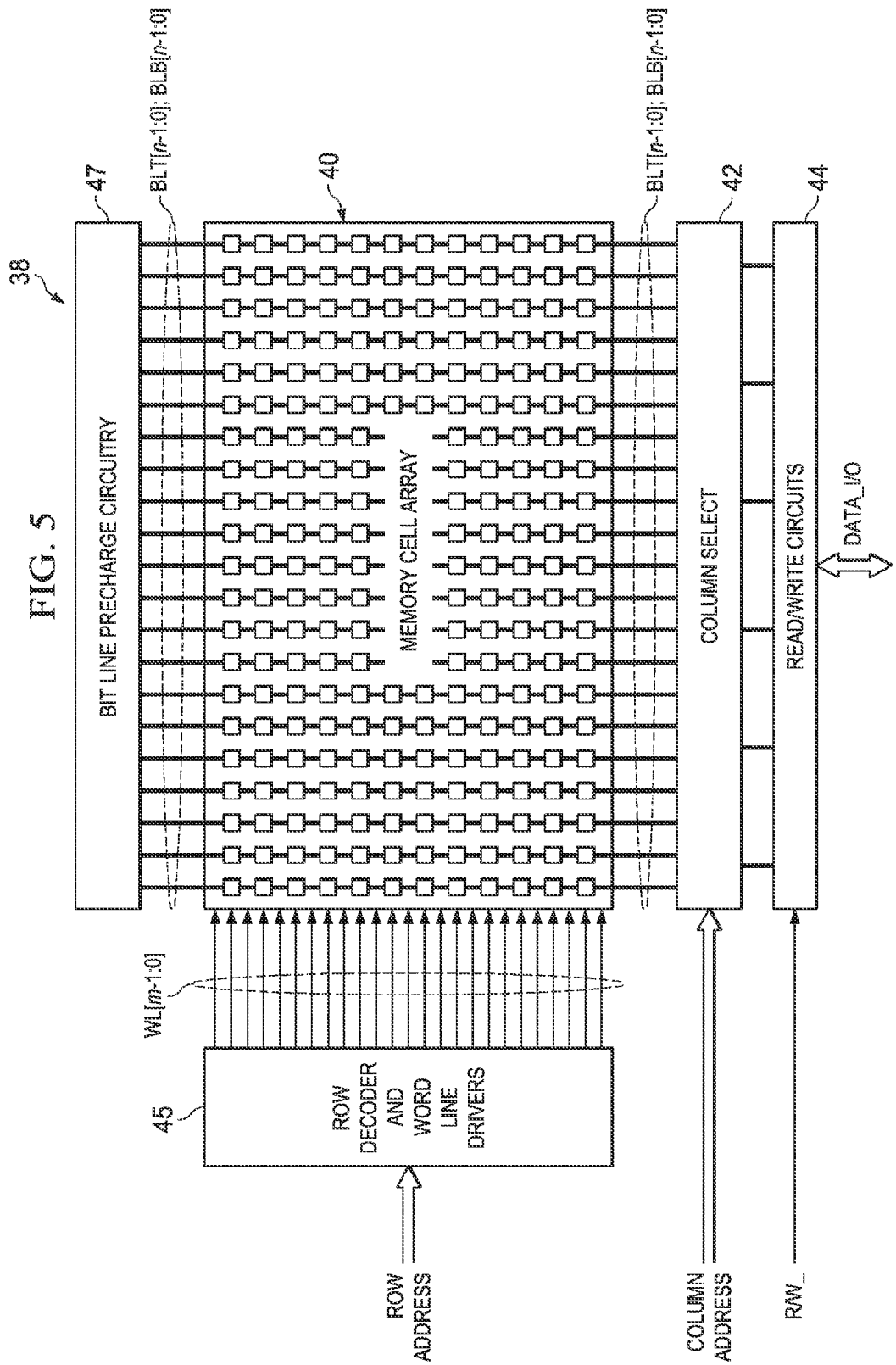

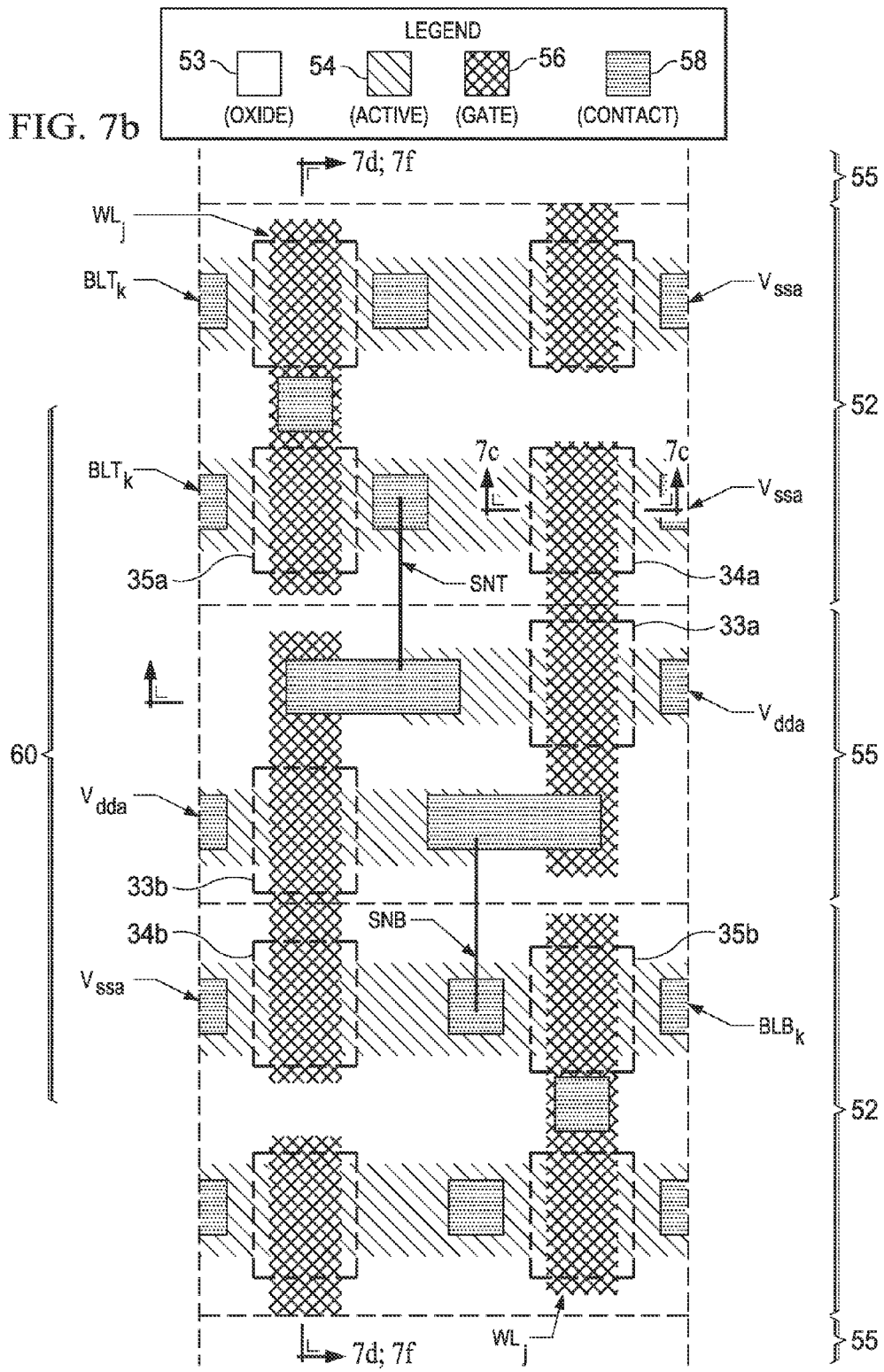

STATIC RANDOM-ACCESS MEMORY CELL ARRAY WITH DEEP WELL REGIONS

CROSS-REFERENCE TO RELATED APPLICATIONS

This application claims priority, under 35 U.S.C. §119(e), of Provisional Application No. 61/655,545, filed Jun. 5, 2012, incorporated herein by this reference.

STATEMENT REGARDING FEDERALLY SPONSORED RESEARCH OR DEVELOPMENT

Not applicable.

BACKGROUND OF THE INVENTION

Many modern electronic devices and systems now include substantial computational capability for controlling and managing a wide range of functions and useful applications. Considering the large amount of digital data often involved in performing the complex functions of these modern devices, significant solid-state memory capacity is now commonly implemented in the electronic circuitry for these systems. Static random access memory (SRAM) has become the memory technology of choice for much of the solid-state data storage requirements in these modern power-conscious electronic systems. As is fundamental in the art, SRAM cells store contents "statically", in that the stored data state remains latched in each cell so long as power is applied to the memory; this is in contrast to "dynamic" RAM ("DRAM"), in which the data must be periodically refreshed in order to be retained.

Advances in semiconductor technology in recent years have enabled the shrinking of minimum device feature sizes (e.g., MOS transistor gates) into the sub-micron range. This miniaturization is especially beneficial when applied to memory arrays, because of the large proportion of the overall chip area often devoted to on-chip memories. As a result, significant memory resources are now often integrated as embedded memory into larger-scale integrated circuits, such as microprocessors, digital signal processors, and "system-on-a-chip" integrated circuits.

An example of a conventional SRAM cell is shown in FIG. 1. In this example, SRAM cell 2 is a conventional six-transistor (6-T) static memory cell 2, which in this case is in the $j^{th}$ row and $k^{th}$ column of a memory array. SRAM memory cell 2 is biased between the voltage on power supply line $V_{dda}$ and a ground reference voltage $V_{ssa}$. SRAM memory cell 2 is constructed in the conventional manner as a pair of cross-coupled complementary MOS (CMOS) inverters, one inverter of series-connected p-channel load transistor 3a and n-channel driver transistor 4a, and the other inverter of series-connected p-channel load transistor 3b and n-channel transistor 4b; the gates of the transistors in each inverter are connected together and to the common drain node of the transistors in the other inverter, in the usual manner. The common drain node of transistors 3a, 4a constitutes storage node SNT, and the common drain node of transistors 3b, 4b constitutes storage node SNB, in this example. N-channel pass-gate transistor 5a has its source/drain path connected between storage node SNT and bit line $BLT_k$ for the $k^{th}$ column, and n-channel pass-gate transistor 5b has its source/drain path connected between storage node SNB and bit line $BLB_k$. The gates of pass-gate transistors 5a, 5b are driven by word line $WL_j$ for this $j^{th}$ row in which cell 2 resides.

In operation, bit lines $BLT_k$, $BLB_k$ are typically precharged by precharge circuitry 7 to a high voltage $V_{ddp}$ (which is at or near power supply voltage $V_{dda}$) and are equalized to that voltage; precharge circuitry 7 then releases bit lines $BLT_k$, $BLB_k$ to then float during the remainder of the access cycle. To access cell 2 for a read operation, word line $WL_j$ is then energized, turning on pass-gate transistors 5a, 5b, and connecting storage nodes SNT, SNB to bit lines $BLT_k$, $BLB_k$. The differential voltage developed on bit lines $BLT_k$, $BLB_k$ is then sensed and amplified by a sense amplifier. In a write operation, typical modern SRAM memories include write circuitry that pulls one of bit lines $BLT_k$, $BLB_k$ low (i.e., to a voltage at or near ground voltage $V_{ssa}$), depending on the data state to be written. Upon word line $WL_j$ then being energized, the low level bit line $BLT_k$ or $BLB_k$ will pull down its associated storage node SNT, SNB, causing the cross-coupled inverters of addressed cell 2 to latch in the desired state.

As known for years in the art, CMOS structures such as memory arrays including CMOS SRAM cell 2 and the like are inherently vulnerable to a condition known as "latchup". Integrated circuits that incorporate p-channel and n-channel MOS field-effect transistors (MOSFETs) near one another necessarily include adjacent regions of n-type and p-type doped silicon that form a p-n-p-n structure. Under certain conditions, those alternating adjacent p-n-p-n regions can operate as a "thyristor", or silicon-controlled rectifier ("SCR"), circuit in which an n-p-n bipolar transistor is paired with a p-n-p bipolar transistor in a feedback arrangement.

FIG. 2a is an electrical schematic of a well-known SCR circuit, based on p-n-p bipolar transistor 10 and n-p-n bipolar transistor 12. In this case, the emitter of transistor 10 is connected to the anode of the SCR, its base is connected to the collector of transistor 12 and, via resistor 13, to power supply voltage $V_{dd}$. The base of transistor 12 is connected to the collector of transistor 10 and, via resistor 11, to ground $V_{ss}$. The emitter of transistor 12 is connected to the cathode of the SCR. In operation, power supply voltage $V_{dd}$ is biased positive relative to ground $V_{ss}$. If the base-emitter junction of transistor 10 becomes forward-biased, due to a sufficiently high voltage at anode A, transistor 10 conducts current into the base of transistor 12, forward-biasing its base-emitter junction and causing conduction that flows into the base of transistor 10. Either of transistors 10, 12 can initiate this conduction. This positive feedback results in a relatively large current conducted between anode A and cathode C. As known in the art, the positive feedback effect is so rapid that a "snapback" in the current-voltage characteristic at the anode, appearing as "negative resistance" as the anode current continues to increase as the anode voltage decreases. So long as the anode voltage remains above a certain voltage (i.e., the "hold" voltage), the SCR will conduct a relatively large current.

These p-n-p-n structures inherent in conventional CMOS integrated circuits form a parasitic SCR that can be triggered into a latchup condition by the coupling of noise to certain nodes during the operation of the integrated circuit. The massive current conducted in such a latchup condition can cause operating failure of the integrated circuit or, in the worst case, an overcurrent condition that physically destroys the integrated circuit.

By way of further background, Boselli et al., "Latch-up in 65 nm CMOS Technology: A Scaling Perspective", $43^{rd}$ *Annual International Reliability Physics Symposium* (IEEE, 2005), pp. 137-44, incorporated herein by reference, describes the behavior of latchup tendencies over the 180 nm, 130 nm, 90 nm, and 65 nm "technology nodes" (i.e., the typical distance between identical features in adjacent memory cells in an array for a given manufacturing technology). As described in that paper, latchup susceptibility appears to decrease as feature sizes shrink. In particular, as the technology scales to smaller features, the latchup feedback loop appears to weaken, the voltage differential between the SCR "hold" voltage and the power supply voltage (e.g., $V_{dd}$) appears to increase, and the temperature dependence of the onset of latchup appears to decrease. All of these observed tendencies indicate that the latchup condition is becoming more difficult to trigger and sustain as CMOS technology scales over time.

It has also been observed that these p-n-p-n structures, when present in CMOS memories such as SRAMs, are vulnerable to single-event-upset (SEU) events. As known in the art, SEU events are typically caused by particles impacting the integrated circuit and causing ionization that results in free charge near a logic node or memory cell. This free charge can forward bias the base-emitter junction of one of the parasitic bipolar transistors, triggering thyristor action and, in the case of an SRAM cell, potentially changing its stored data state. The bit error rate due to SEUs can become sufficiently high that conventional error-correction techniques cannot correct for all errors, particularly if the SEUs cause multiple cell upsets (MCUs) in the same stored data word. The probability of MCUs tends to increase as minimum device feature sizes scale smaller, especially for feature sizes in the deep-sub-micron domain (e.g., 65 nm).

FIG. 2b illustrates a cross-section of a typical conventional CMOS structure, such as may be encountered in an array of SRAM cells 2, and in which a parasitic SCR resides. The structure of FIG. 2b is constructed according to a twin-well technology, with n-type well 16 and p-type well 18 disposed at the surface of p-type substrate 14. N-type well 16 is a relatively lightly-doped region into which p-channel MOS transistors are formed; conversely, p-type well 18 is a relatively lightly-doped region into which n-channel MOS transistors are formed. The structure of FIG. 2b may alternatively correspond to a single n-well technology, if p-well 18 is not separately implanted but is instead merely a surface portion of p-type substrate 14. Shallow trench isolation dielectric structures 15 define several active regions of the surface of wells 16, 18, each of which includes a relatively heavily-doped region at the surface. In this example, n-well 16 includes heavily-doped n+ region 17n and heavily-doped p+ region 17p, and p-well 18 includes heavily-doped n+ region 19n and heavily-doped p+ region 19p. As known in the art, heavily-doped regions 17n, 19p are within wells 16, 18, respectively, of the same conductivity type and thus serve as well contacts (n+ region 17n at power supply voltage $V_{dd}$ and p+ region 19p at ground $V_{ss}$). In this construction, p+ region 17p corresponds to the emitter of p-n-p transistor 10 in the parasitic SCR, n+ region 19n corresponds to the emitter of lateral n-p-n transistor 12, n+ region 17n is the base contact of transistor 10 and the collector contact of transistor 12, and p+ region 19p is the base contact of transistor 12 and the collector contact of transistor 10. Resistor 11 of the parasitic SCR is constituted by the lateral resistance of well 18 and substrate 14, and resistor 13 is the lateral resistance of well 16.

Considering this construction, thyristor behavior in the CMOS structure of FIG. 2b can be triggered by noise coupling, or by free charge due to an SEU, of sufficient magnitude to forward bias the junctions at either (or both) of the emitter nodes at p+ region 17p and n+ region 19n. Because of the junction capacitance of regions 17p, 19n, dV/dt induced current can be injected into the base of one of transistors 10, 12, respectively. If the lateral resistance of the corresponding resistor 11, 13 is too high, the base-emitter junction of the transistor 10, 12 receiving the injection current can forward bias, initiating base current in the opposite parasitic device that, through the positive feedback mechanism described above, results in a latchup state with large current conducted from anode A (p+ region 17p) to cathode C (n+ region 19n).

The risk of latchup and SEUs in conventional CMOS integrated circuits is minimized by ensuring that well contacts are present at a sufficient spatial frequency. These well contacts ensure that the base-emitter junctions of the parasitic bipolar transistors in the structure are not significantly forward-biased. It has been observed that the latchup and SEU threshold of the structure of FIG. 2b is largely determined by the resistance of parasitic resistor 13 in n-well 16, which depends on the spacing of well-tie n+ regions 17n (which receive power supply voltage $V_{dd}$) within n-wells 16. Close spacing of well-tie n+ regions 17n will keep that well resistance low, to limit the voltage drop caused by SEU or noise current to a level that maintains the base-emitter voltage of parasitic p-n-p transistor 10 below its forward bias threshold.

FIG. 2c illustrates, in cross-section, a conventional CMOS structure with improved latchup and SEU tolerance relative to that of FIG. 2b. The structure of FIG. 2c is similar to that of FIG. 2b, including both n-well 16 and p-well 18. However, the structure of FIG. 2b also includes deep n-well region 16D, which is an n-type doped region of the structure that is formed, by ion implantation, at a depth below that of n-well 16 and p-well 18. In conventional SRAMs and other integrated circuits similarly constructed, deep n-well region 16D underlies the entirety of the CMOS memory array or other operative region, and functions to connect each of n-wells 16 to one another in that region. For purposes of SEU and latchup prevention, deep n-well 16D reduces the resistance of base resistor 13 in parasitic p-n-p transistor 10, by effectively increasing the cross-sectional area of the semiconductor structure defining resistor 13. In addition, the additional junction capacitance at n-well 16 is increased by the provision of deep n-well 16D; as known in the art, increased capacitance at the node receiving the free charge (in an SEU) or noise will reduce the resulting voltage at that node, inhibiting the forward biasing of the parasitic base-emitter junction and thus increasing the amount of charge required to trigger the parasitic thyristor from p-n-p transistor 10.

However, it has been observed, in connection with CMOS structures such as that of FIG. 2c, that the presence of deep n-well 16D tends to increase the resistance of parasitic base resistor 11 and reduce the parasitic capacitance of p-well 18, relative to that of parasitic base resistor 13 and n-well 16. These effects increase the susceptibility of n-p-n transistor 12 to initiate latchup in response to noise or an SEU event. As a result, it is the frequency and spacing of well-tie p+ regions 19p within p-wells 18 that determines the effective well or substrate resistance of parasitic resistor 11, and thus the sensitivity of the structure to latchup and SEU.

FIG. 3 illustrates the layout of memory cell array 20 (or, alternatively, one memory cell array block of a multiple-block memory cell array 20, as the case may be) in a conventional integrated circuit. In this example, memory cell array 20 includes two half-arrays 22, each of which contain a number of SRAM cells 2 arranged in rows and columns. In this conventional example, SRAM cells 2 are realized as CMOS circuits, with structures corresponding to those described above in connection with FIGS. 1, 2b, and 2c (including at least one well region (e.g., n-well 16 containing p-channel transistors 3a, 3b, and perhaps deep n-well 16D). As shown in FIG. 3, dummy cell rows 23 are provided on opposite ends of memory cell array 20. These dummy cell rows 23 are constructed similarly as SRAM cells 2 within half-arrays 22, but are not connected or otherwise operable as memory cells. Dummy cell rows 23 are instead provided to maintain photolithographic regularity for the outermost cells 2 in half-arrays 22, as conventional for integrated circuits realized by sub-micron feature sizes. Typically, well contacts in the form of well-tie regions 17n, 19p are provided within dummy cell rows 23, contacted by overlying metal conductors biased at the appropriate power supply or ground voltage (e.g., voltages $V_{dd}$, $V_{ss}$, etc.) in operation.

The conventional layout of FIG. 3 also includes strap row 24 disposed between half-arrays 22 as shown. Strap row 24 also contains "top-side" well contacts to either or both of n-wells 16 and p-wells 18, to which overlying metal conductors route the appropriate power supply or ground voltage (e.g., voltages $V_{dd}$, $V_{ss}$, etc.). In this arrangement, in which strap row 24 runs vertically (in the view of FIG. 3), wells 16, 18 would run horizontally (in the view of FIG. 3), to minimize the spacing of well-tie regions 17n, 19p. It is contemplated that, of course, additional strap rows 24 may be necessary within memory cell array 20, depending on the particular layout and manufacturing parameters, on the size of memory cell array 20.

Of course, additional chip area is required for the realization of each strap row 24 and each dummy cell row 23 to be of sufficient size to accommodate well region contacts. Particularly in those integrated circuits with substantial chip area already consumed by multiple instances of memory cell array 20, the provision of one or more strap rows 24 within each memory cell array 20 to avoid latchup can amount to a significant cost. It has also been observed that conventional well contacts, and thus conventional strap rows 24 and dummy cell rows 23, do not scale with reductions in gate level feature sizes (i.e., transistor gate lengths), considering that these well contacts tend to be defined by metal conductor pitch, rather than by gate level features. Therefore, as minimum feature sizes continue to be reduced by advances in photolithography and other processing technologies, the fraction of the overall chip area consumed in order to make well region contacts for the array grows. In some modern integrated circuits including memory cell arrays 20, a chip area penalty for array well region contacts of as high as 3% has been observed at the current state-of-the-art technology node.

By way of further background, copending and commonly assigned application Ser. No. 13/558,003, filed Jul. 25, 2012, entitled "Efficient Static-Random Access Memory Layout", incorporated herein by this reference, describes a complementary metal-oxide-semiconductor (CMOS) static random access memory (SRAM) with no well contacts within the memory array, and in which wells of either or both conductivity types may electrically float during operation of the memory. An example of such a memory constructed with a deep n-well underlying the memory array is disclosed.

BRIEF SUMMARY OF THE INVENTION

Embodiments of this invention provide a solid-state memory, and methods of operating and fabricating the same, that provides improved robustness to single-event upset (SEU) and latchup, and thus provides reduced soft and hard error failure rates.

Embodiments of this invention provide such a memory and methods that provides such improved robustness while enabling fabrication of the integrated circuit in reduced integrated chip area.

Embodiments of this invention provide such a memory and methods that are compatible with modern deep sub-micron manufacturing technologies.

Other objects and advantages of embodiments of this invention will be apparent to those of ordinary skill in the art having reference to the following specification together with its drawings.

Embodiments of this invention may be implemented into a CMOS memory cell array constructed according to either a single-well or double-well technology, by forming a plurality of deep well regions of opposite conductivity type from the surrounding semiconductor material, underlying the memory cell array. Those wells at the surface that are of the same conductivity type as the deep well regions contact the deep well regions, forming a two-dimensional grid. Wells or surface regions of the opposite conductivity type are similarly connected together between the deep well regions, also forming a two-dimensional grid.

BRIEF DESCRIPTION OF THE SEVERAL
VIEWS OF THE DRAWING

FIG. 2b is a cross-sectional view of a conventional CMOS structure including the parasitic SCR of FIG. 2a.

FIG. 2c is a cross-sectional view of another conventional CMOS structure including the parasitic SCR of FIG. 2a.

FIG. 5 is an electrical diagram, in block form, of a memory in the integrated circuit of FIG. 4 according to embodiments of this invention.

FIG. 7b is a plan view.

DETAILED DESCRIPTION OF THE INVENTION

This invention will be described in connection with certain of its embodiments, for example as implemented into an array of static random access memory (SRAM) cells implemented according to complementary metal-oxide-semiconductor (CMOS) technology, as it is contemplated that this invention will be especially beneficial when implemented in such an application. However, it is further contemplated that this invention may provide benefit when applied in other types of integrated circuits, including other types of memories such as dynamic RAMs, read-only memories (ROMs), and the like, as well as in other types of integrated circuits. Accordingly, it is to be understood that the following description is provided by way of example only, and is not intended to limit the true scope of this invention as claimed.

Figure 1:
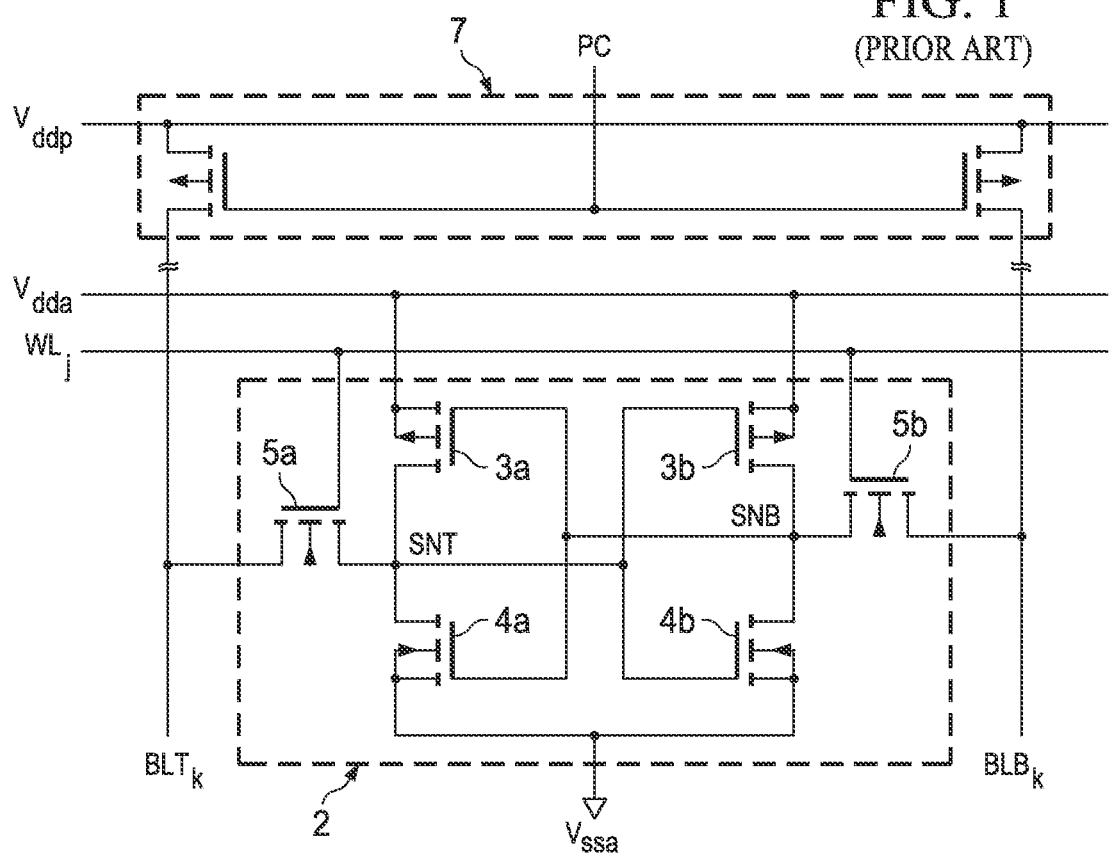
FIG. 1 is an electrical diagram, in schematic form, of a conventional 6-transistor (6-T) static random access memory (SRAM) cell.
Figure 2A:
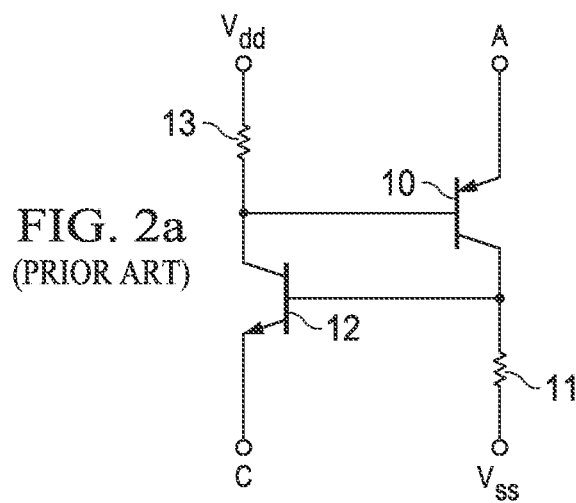
FIG. 2a is an electrical diagram, in schematic form, of a parasitic SCR that is present in conventional complementary metal-oxide-semiconductor (CMOS) circuits.
Figure 2B:
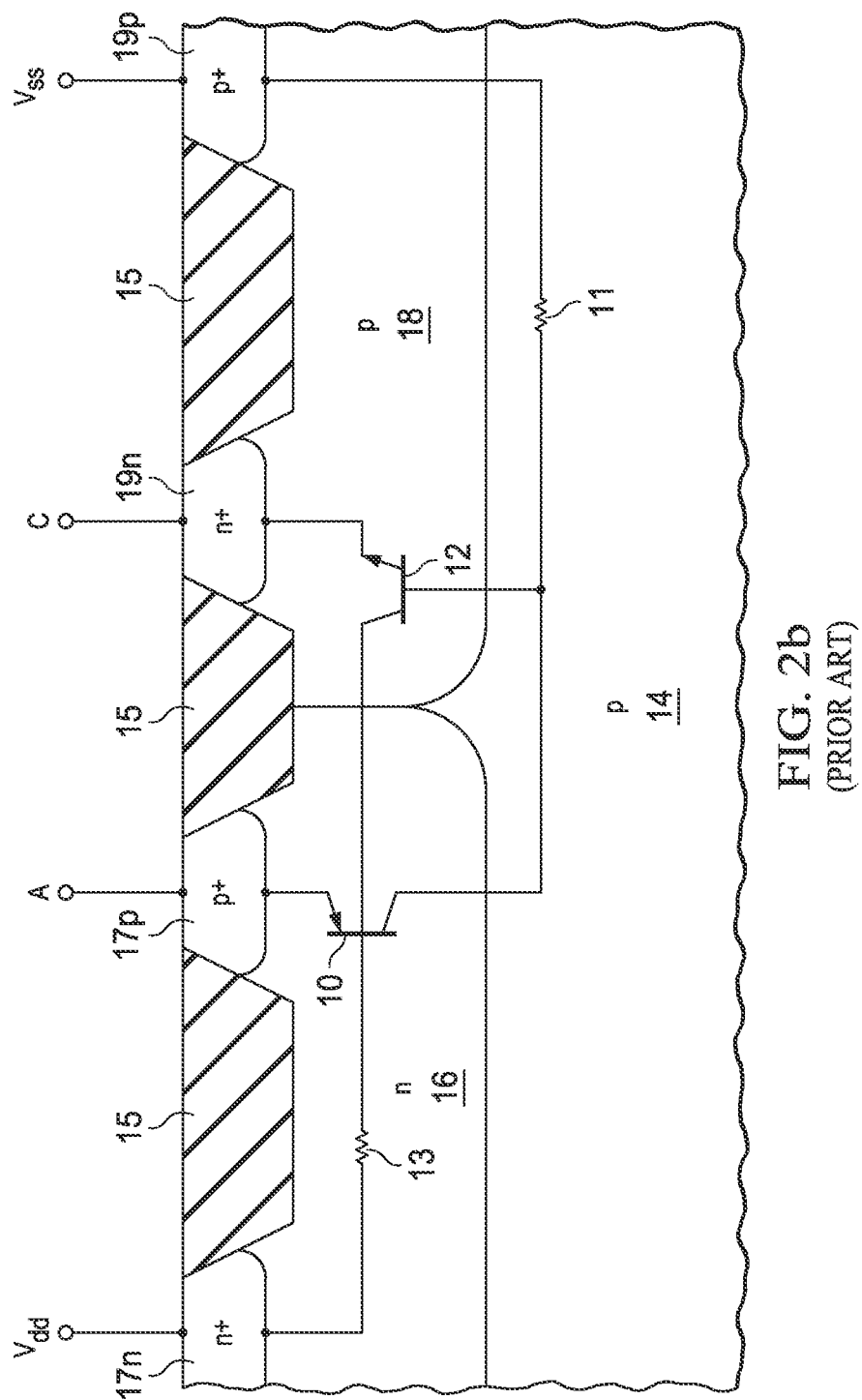
Figure 2C:
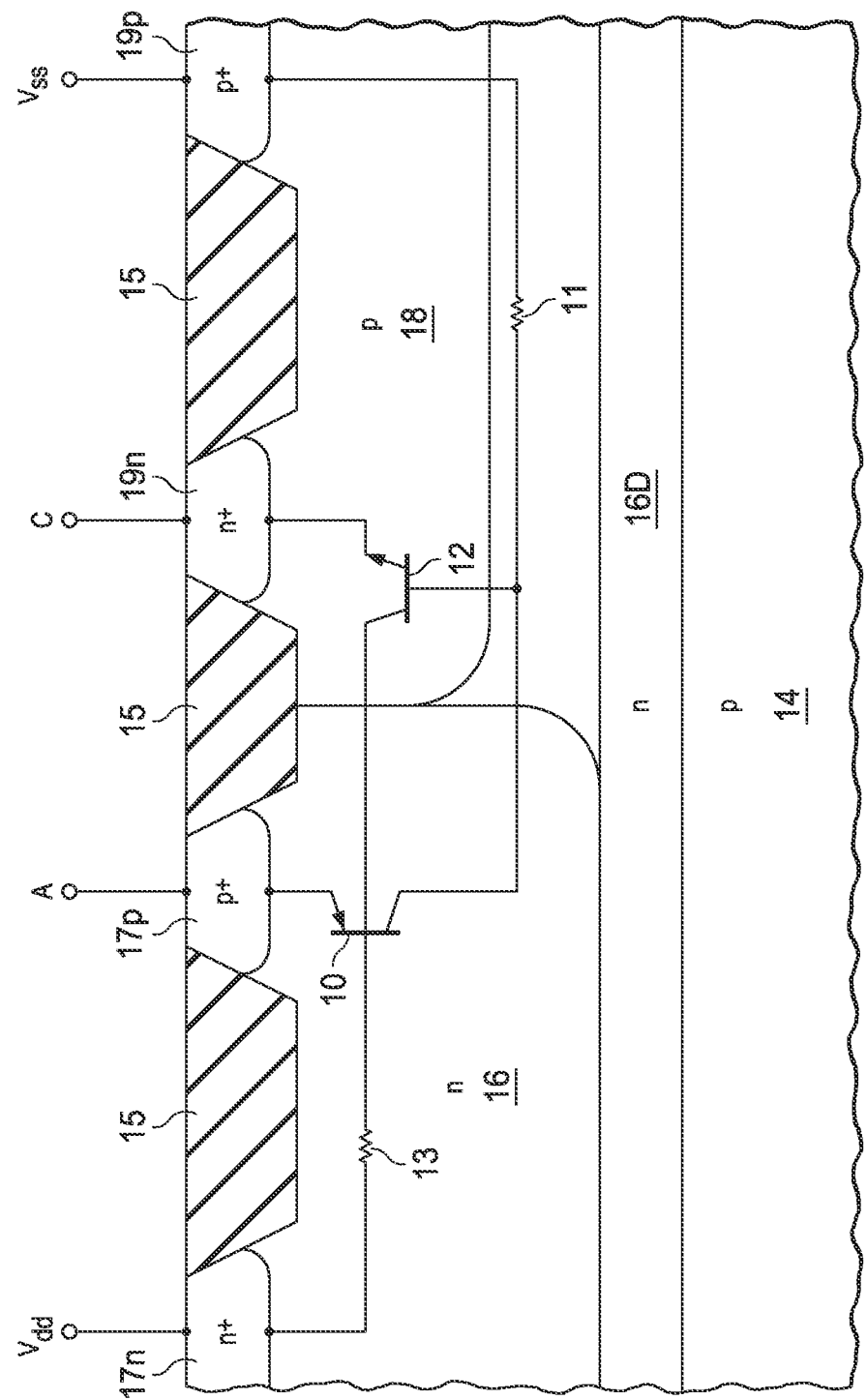
Figure 3:
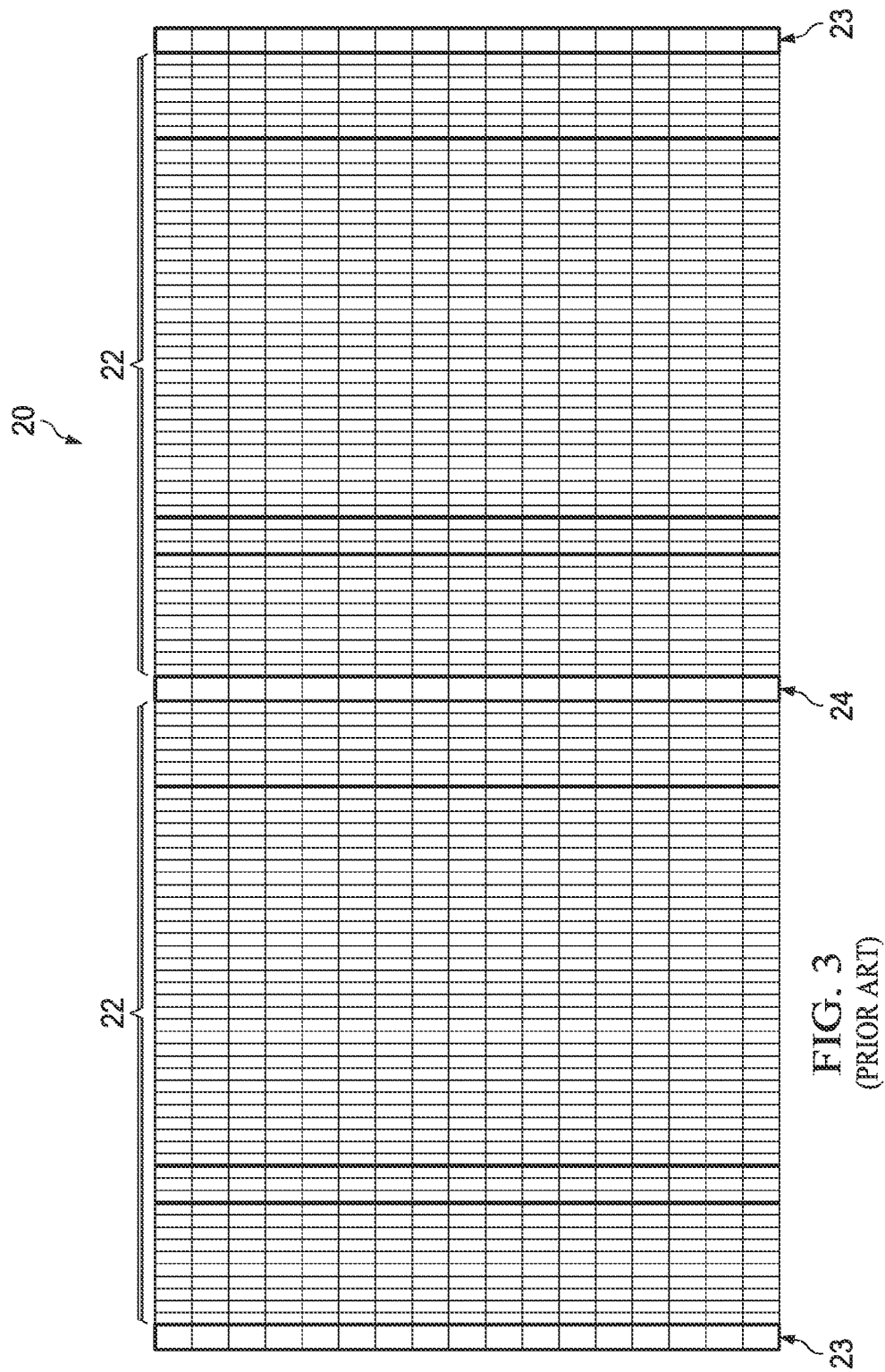
FIG. 3 is a layout view of a conventional memory cell array.
Figure 4:
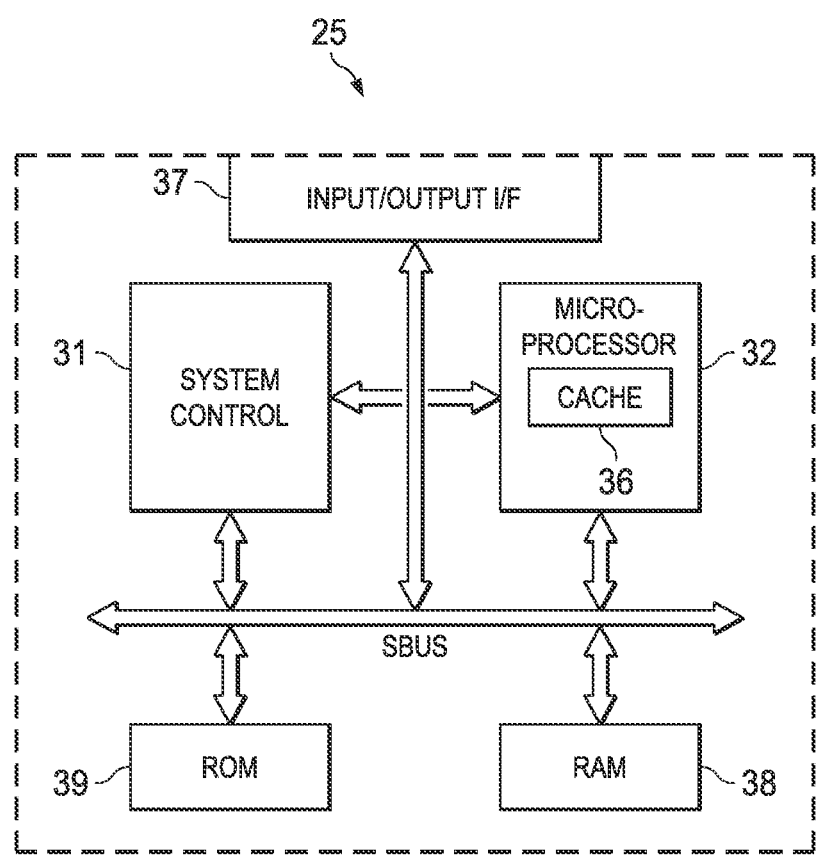
FIG. 4 is an electrical diagram, in block form, of an integrated circuit constructed according to embodiments of this invention.

FIG. 4 illustrates an example of large-scale integrated circuit 25, in the form of a so-called "system-on-a-chip" ("SoC"), as now popular in many electronic systems. Integrated circuit 25 is a single-chip integrated circuit into which an entire computer architecture is realized. As such, in this example, integrated circuit 25 includes a central processing unit of microprocessor 32, which is connected to system bus SBUS. Various memory resources, including random access memory (RAM) 38 and read-only memory (ROM) 39, reside on system bus SBUS and are thus accessible to microprocessor 32. In many modern implementations, ROM 39 is realized by way of electrically erasable programmable read-only memory (EEPROM), a common type of which is referred to as "flash" EEPROM. ROM 39 typically serves as program memory, storing the program instructions executable by microprocessor 32, while RAM 38 serves as data memory; in some cases, program instructions may reside in RAM 38 for recall and execution by microprocessor 32. Cache memory 36 (such as level 1, level 2, and level 3 caches, each typically implemented as SRAM) provides another memory resource, and resides within microprocessor 32 itself and therefore does not require bus access. Other system functions are shown, in a generic sense, in integrated circuit 25 by way of system control 31 and input/output interface 37.

Those skilled in the art having reference to this specification will recognize that integrated circuit 25 may include additional or alternative functions to those shown in FIG. 4, or may have its functions arranged according to a different architecture from that shown in FIG. 4. The architecture and functionality of integrated circuit 25 is thus provided only by way of example, and is not intended to limit the scope of this invention.

Further detail in connection with the construction of RAM 38 in integrated circuit 25 is illustrated in FIG. 5. Of course, a similar construction may be used to realize other memory resources such as cache memory 36 and ROM 39 (as applicable); further in the alternative, RAM 38 may correspond to a stand-alone memory integrated circuit (i.e., rather than as embedded memory as shown in FIG. 4). Those skilled in the art having reference to this specification will comprehend that the memory architecture of RAM 38 in FIG. 5 is provided by way of example only.

In this example, RAM 38 includes many memory cells arranged in rows and columns within memory cell array 40. While a single instance of memory cell array 40 is shown in FIG. 5, it is to be understood that RAM 38 may include multiple memory cell arrays 40, each corresponding to a memory block within the address space of RAM 38.

In the example shown in FIG. 5, memory cell array 40 includes m rows and n columns of SRAM cells, with cells in the same column sharing a pair of bit lines BLT[n−1:0], BLB[n−1:0], and with memory cells in the same row sharing one of word lines WL[m−1:0]. Bit line precharge circuitry 47 is provided to apply a desired precharge voltage to the pairs of bit lines BLT[n−1:0], BLB[n−1:0] in advance of read and write operations. Row decoder and word line drivers 45 receive a row address value indicating the row of memory cell array 40 to be accessed, and energize the one of word lines WL[m−1:0] corresponding to that row address value. Column select circuit 42 receives a column address value, and in response selects pairs of bit lines BLT[n−1:0], BLB[n−1:0] associated with one or more columns to be placed in communication with read/write circuits 44. Read/write circuits 44 are constructed in the conventional manner, for example to include the typical differential amplifier coupled to the bit lines for a column as selected by column select circuit 42 and a write circuit for selectively pulling toward ground one of the bit lines in the selected pair. The example of RAM 38 shown in FIG. 5 is constructed to an "interleaved" architecture, in which a given memory address selects one of every x (e.g., one of every four) columns for read or write access. The data words stored in memory cell array 40 are thus interleaved with one another, in the sense that the memory address decoded (in part) by column select circuit 42 selects one column in each group of columns, along the selected row. Alternatively, memory cell array 40 may be arranged in a non-interleaved fashion, in which each cell in the selected row is coupled to a corresponding read/write circuit in each cycle. In that architecture, read/write circuits 44 could reside between bit lines BL[n−1:0], and column select circuits 42, with the column select circuits selecting which read/write circuits 44 (and thus which columns) are in communication with data bus DATA I/O.

Figure 6A:
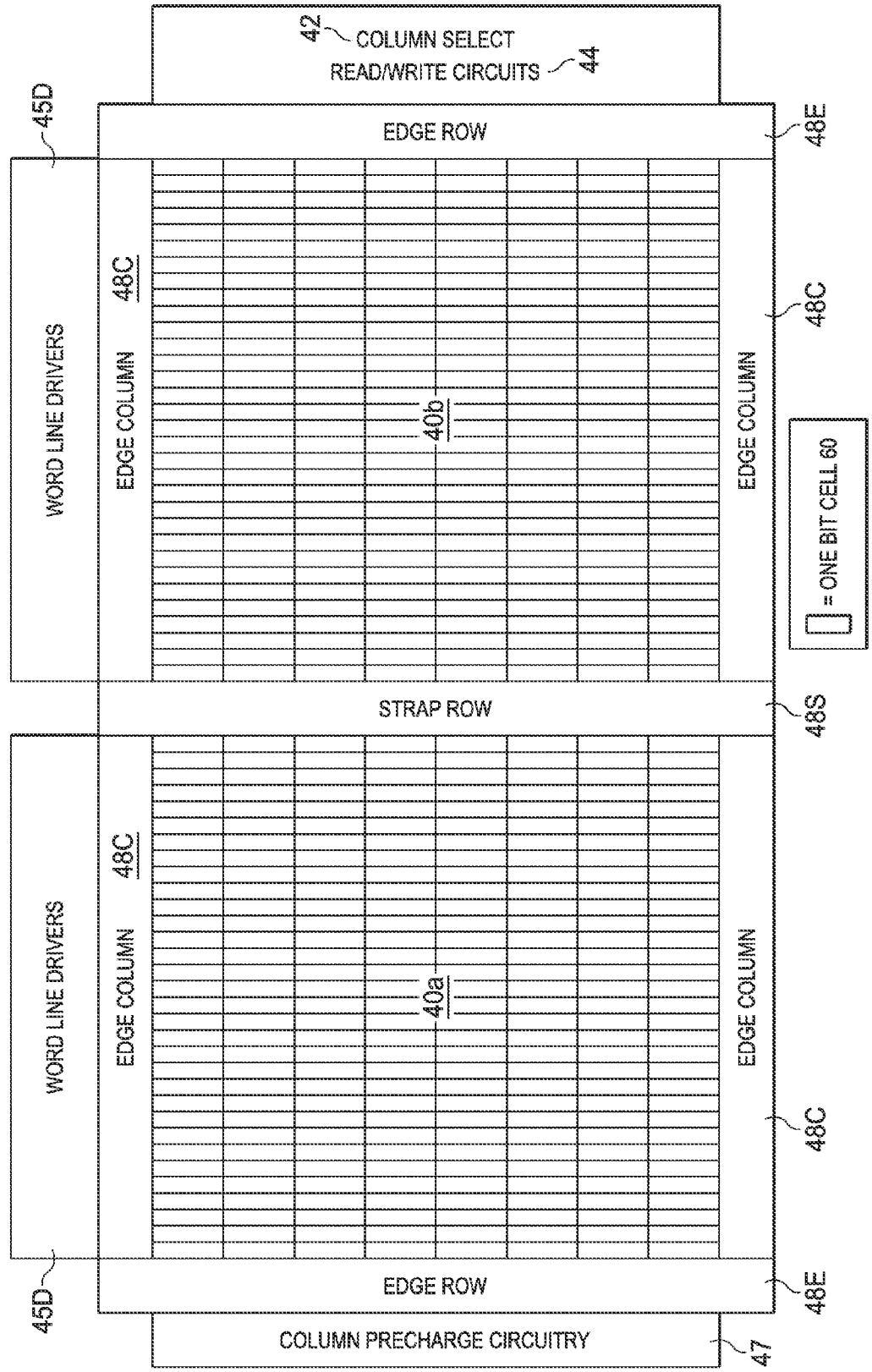
FIGS. 6a and 6b are layout views of a memory cell array in the memory of FIG. 5 according to embodiments of the invention.

FIG. 6a illustrates, in a plan layout view, an example of memory cell array 40 according to embodiments of this invention. In this example, memory cell array 40 consists of two array blocks 40a, 40b; of course, memory cell array 40 may include more than two array blocks, as desired. Each of array blocks 40a, 40b is a generally rectangular array of bit cells 60, each bit cell 60 corresponding to a rectangular area of the integrated circuit structure within which a memory cell is realized, as will be described below. Bit cells 60 are arranged in rows and columns within each of array blocks 40a, 40b in the conventional manner. In the view of FIG. 6a, rows of bit cells 60 are in the vertical direction, and columns of bit cells 60 are in the horizontal direction. In other words, word lines WL[m−1:0] will run vertically, and bit lines BLT[n−1:0], BLB[n−1:0] will run horizontally. As such, word line drivers 45D are located adjacent to array blocks 40a, 40b on the top side of each, in the layout of FIG. 6a. Conversely, column select 42 and read/write circuits 44 are along the right side of array block 40b, and precharge circuitry 47 is along the left side of array block 40a, these circuits serving both of array blocks 40a, 40b in this example.

Strap row 48S is disposed between array blocks 40a, 40b in this embodiment of the invention. As will be described in further detail below, strap row 48S is an area of the integrated circuit at which "top-side" well contacts are made to either or both of n-type and p-type wells in array blocks 40a, 40b. These well contacts may be made by way of metal conductors that route the appropriate power supply or ground voltage (e.g., voltages $V_{dd}$, $V_{ss}$, etc.) to contact implanted or otherwise doped regions within the body of integrated circuit 25, as will also be described below. In addition, strap row 48S may include structures similar to the structures of memory cells within bit cells 60, in the form of "dummy" cells or parts of "dummy" cells, to maintain photolithographic regularity and minimize proximity effects, as known in the art. Also in this arrangement, to maintain photolithographic regularity and minimize proximity effects, edge rows 48E and edge columns 48C are disposed on the outside edges of array blocks 40a, 40b, and consist of "dummy" cells including structures similar to those of the memory cells in bit cells 60. In some embodiments of this invention, top-side well contacts are also provided in edge columns 48C and edge rows 48E. As such, strap rows 40S, edge columns 48C, and edge rows 40E constitute well-tie areas in this embodiment of the invention, within which bias conductors can make contact to either or both of p-type and n-type wells within array blocks 40a, 40b.

Alternatively, as described in commonly assigned and copending application Ser. No. 13/558,003, incorporated herein by reference, either or both of p-type and n-type well regions within array blocks 40a, 40b may be allowed to electrically float, in which case the top-side well contacts within strap rows 40S, edge columns 48C, and edge rows 40E would not be implemented. If photolithographic regularity is required, strap rows 40S, edge columns 48C, and edge rows 40E can still be provided even if well contacts are not made.

Further in the alternative, as described in U.S. Patent Application Publication No. US 2012/0106225, published May 3, 2012, commonly assigned herewith and incorporated hereinto by reference, any or all of peripheral circuitry such as row decoder and word line drivers 45, precharge circuitry 47, column select circuitry 42, and read/write circuits 44 may be implemented using structures that are photolithographically similar to those structures constituting memory cells in bit cells 60. In such a case, edge rows 48E need not be present, and the well-tie areas may be constituted within the area of this peripheral circuitry, for those cases in which either or both of the p-type and n-type wells are to be biased within array blocks 40a, 40b.

Figure 7A:
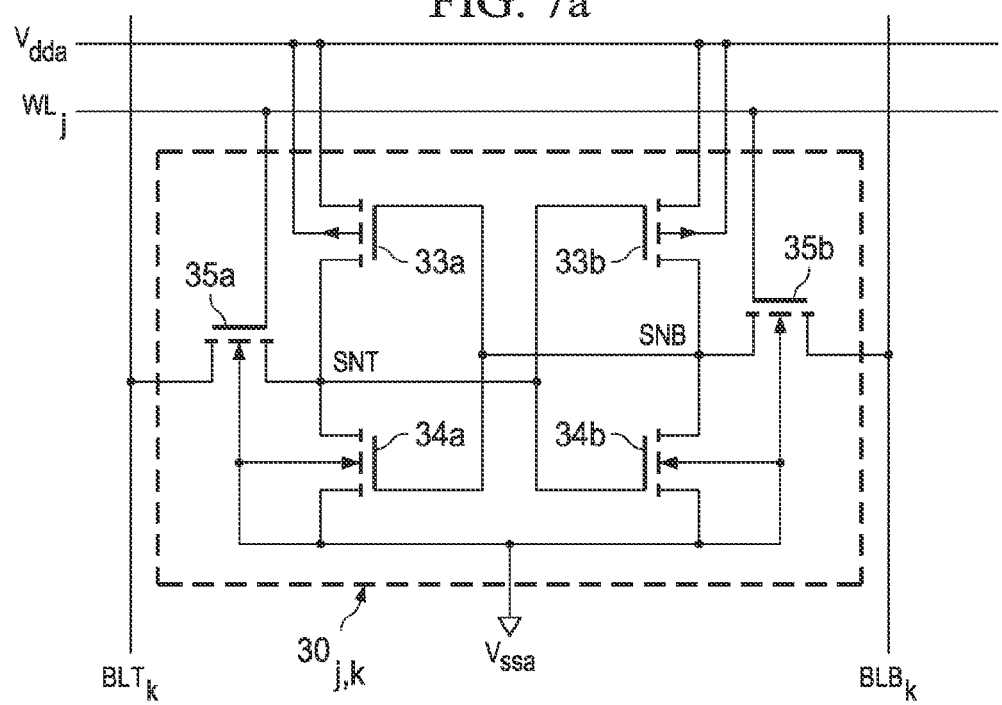
FIG. 7a is an electrical diagram, in schematic form, of a 6-T SRAM cell according to embodiments of this invention.

FIG. 7a schematically illustrates an example of the construction of memory cell $30_{jk}$ in memory cell array 40, according to embodiments of this invention. Cell $30_{jk}$ includes, in the conventional manner, one CMOS inverter constructed from series-connected p-channel load transistor 33a and n-channel driver transistor 34a, and another CMOS inverter of series-connected p-channel load transistor 33b and n-channel transistor 34b. The source/drain paths of transistors 33a, 34a, and also the source/drain paths of transistors 33b, 34b, are connected in series between bias conductors carrying power supply voltage $V_{dda}$ and ground voltage $V_{ssa}$. The gates of transistors 33a, 34a in one inverter are connected together and to the common drain node of transistors 33b, 34b of the opposite inverter at storage node SNB; similarly, the gates of transistors 33b, 34b are connected together and to the common drain node of transistors 33a, 34a at storage node SNT. N-channel pass-gate transistors 35a, 35b have their source/drain paths connected between storage nodes SNT, SNB, respectively, and respective bit lines $BLT_k$, $BLB_k$ for column k of array 40. Word line $WL_j$ for row j controls the gates of transistors 35a, 35b.

As will be described in further detail below, p-channel load transistors 33a, 33b of cell $30_{j,k}$ are formed within an n-well at the surface of integrated circuit 25, as is typical for modern CMOS integrated circuits. In some embodiments of the invention, the body nodes of transistors 33a, 33b are connected to a bias voltage, for example power supply voltage $V_{dda}$, by way of one or more well contacts in strap row 48S or edge rows 48E, or both. Alternatively, as mentioned above, the n-wells in which transistors 33a, 33b are constructed may be allowed to electrically float, which eliminates the need for a physical well contact.

In embodiments of this invention, n-channel transistors 34a, 34b, 35a, 35b of cell $30_{j,k}$ may be formed within p-type doped regions. These p-type doped regions, which are the body nodes of n-channel driver transistors 34a, 34b and pass transistors 35a, 35b, may be portions of the p-type substrate at locations between n-wells, or p-type well regions in a twin-well technology. The body nodes of transistors 34a, 34b, 35a, 35b are connected to a bias voltage, for example ground ($V_{ssa}$), also by way of one or more well contacts in any or all of strap row 48S, edge columns 48C, and edge rows 48E. Alternatively, as mentioned above, these p-type regions may be allowed to electrically float. If these p-type regions are biased, top-side contacts to the p-type regions of the surface may be made within either or both of strap row 48S and edge rows 48E, if desired.

Conversely, if integrated circuit 25 is formed in an n-type substrate, a single well construction would provide one or more p-wells within which n-channel transistors 34, 35 for each cell $30_{jk}$ that is formed, with p-channel transistors 33a, 33b formed at the surface of that n-type substrate. Of course, an n-type substrate may also support a twin-well construction, in which both p-wells and n-wells are provided within memory cell array 40.

Figure 7C:
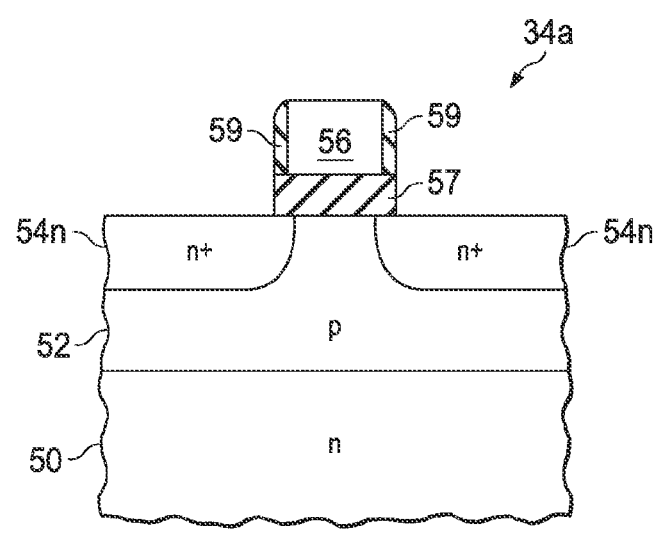
FIGS. 7c through 7f are cross-sectional views, of SRAM cells in the layout of FIG. 6a according to embodiments of this invention.
Figure 7D:
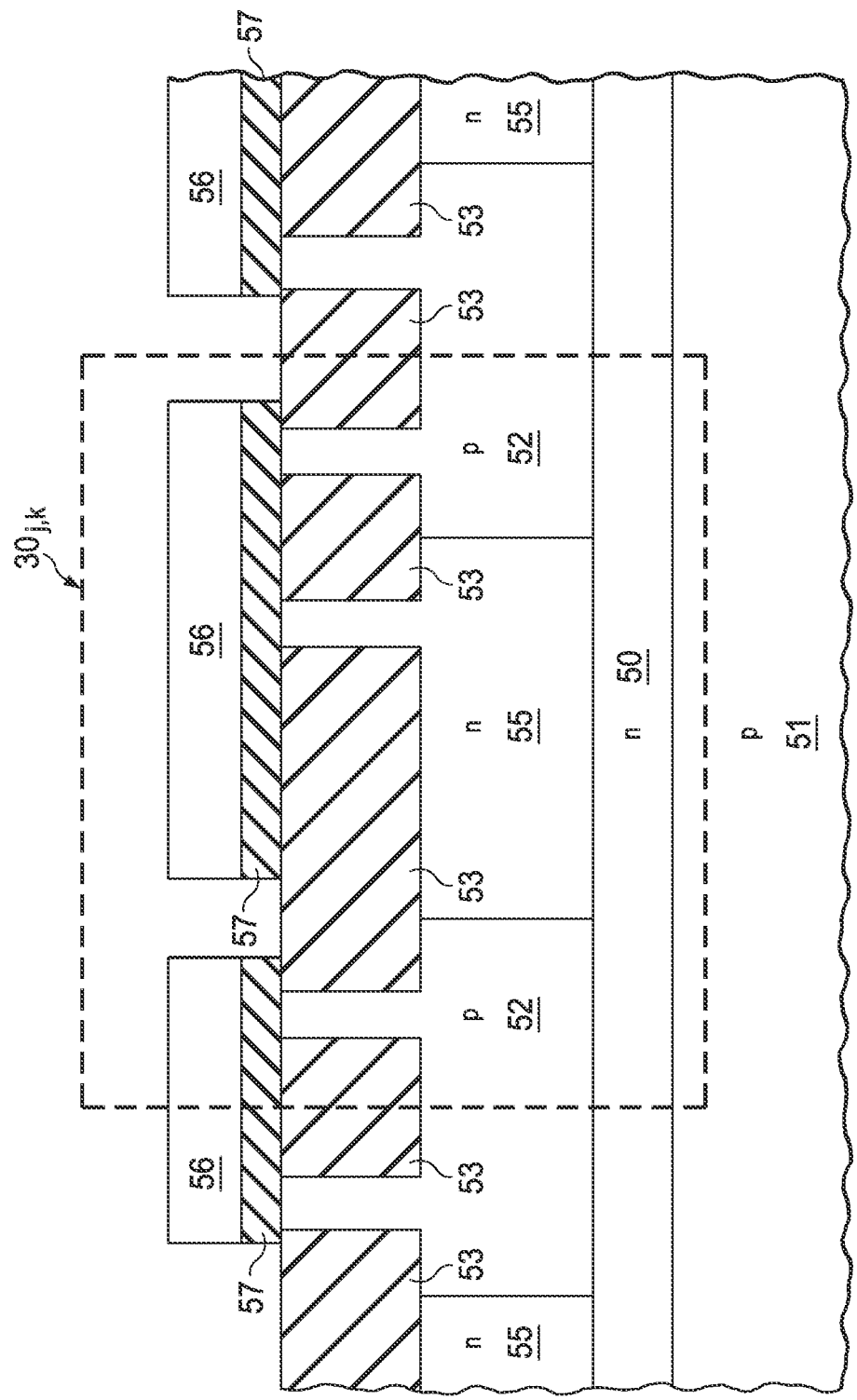
Figure 7E:
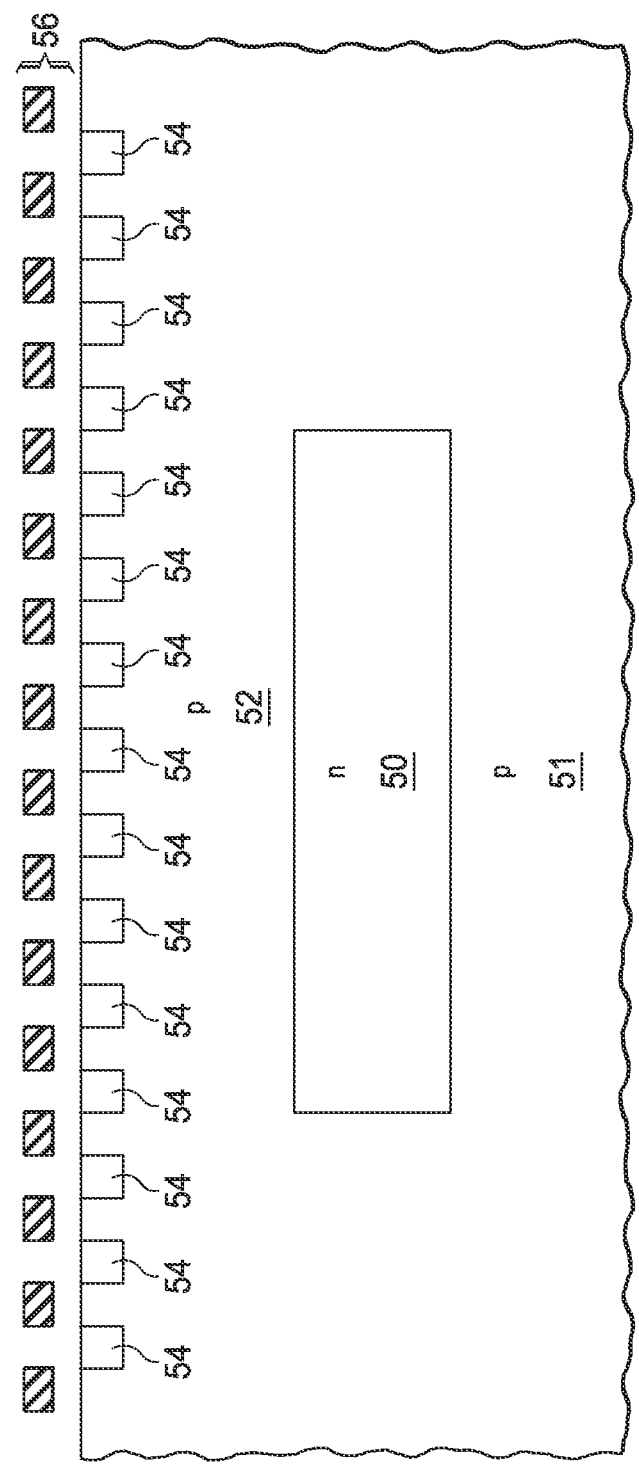

FIG. 7b is a plan view, and FIGS. 7c through 7e are cross-sectional views, of an example of the layout of memory cell $30_{jk}$ in bit cell 60 at the surface of a silicon substrate, according to an embodiment of this invention constructed by a single-well CMOS technology in which n-wells are formed into a p-type substrate or bulk layer. The views of FIGS. 7b through 7e are at a stage in the manufacture prior to the formation of overlying metal layers. Bit cell 60 is shown in FIG. 7b in the same orientation as that shown in FIG. 6a, such that memory rows run vertically and columns run horizontally in this view. In this example, active regions 54 are locations of the surface of n-well 55 or p-type region 52, as the case may be, at which dielectric isolation structures 53 are not present. As known in the art and as shown by example in FIGS. 7d and 7e, isolation dielectric structures 53 are relatively thick structures of silicon dioxide or another dielectric material that isolate transistor source and drain regions in separate transistors from one another. Isolation dielectric structures 53 are typically formed by way of shallow trench isolation (STI) structures in modern high-density integrated circuits, or alternatively by the well-known local oxidation of silicon (LOCOS) process. Also in FIG. 7b, n-wells 55 and p-type regions 52 of this portion of memory cell array 40 are indicated. More specifically, p-type regions 52 are those locations of the surface at which an instance of n-well 55 is not formed, separated from one another instances by instances of n-wells 55.

Alternatively, as mentioned above, in a twin-well process, p-type regions 52 will correspond to p-type wells formed into the surface of the semiconductor substrate or bulk layer, substantially at the same locations representative of p-type regions 52 in FIG. 7b.

As well known in the art, transistors are formed at locations of active regions 54 that underlie gate elements 56. FIG. 7c illustrates, in cross-section, the construction of n-channel MOS driver transistor 34a, by way of example. As shown in FIG. 7c, transistor 34a is constructed at the surface of p-well 52, at a location at which gate element 56 (extending into and out of the page) crosses active region 54. Gate element 56 is separated from the surface of active region 54 by gate dielectric layer 57 as shown. N+ regions 54n are formed into the surface of active region 54 in the conventional self-aligned manner, by way of ion implantation and a subsequent activation anneal. If desired, sidewall dielectric filaments 59 may be formed on the sides of gate element 56, such sidewall filaments 59 used to separate the reach of separate source/drain ion implantation processes, to create graded junction ("lightly-doped drain") extensions of source/drain regions 54n. The portion of p-well 52 underlying gate element 56, and not doped by the source/drain implant and anneal, remains p-type and will serve as the channel region (i.e., body node) of transistor 34a.

Various materials may be used for gate element 56 and gate dielectric 57. Commonly used materials include polycrystalline silicon for gate element 56, and silicon dioxide or silicon nitride (or a combination of the two) for gate dielectric 57. Alternatively, high-k dielectric materials such as hafnium oxide ($HfO_2$), in combination with gate elements formed of metals or metal compounds such as titanium nitride, tantalum silicon nitride, and tantalum carbide, may be used in embodiments of this invention.

FIG. 7b illustrates the locations of contact openings 58 that extend through overlying insulator material (not shown) to active regions 54 or to gate elements 56, at the case may be. Metal conductors (two of which are shown schematically in FIG. 7b for storage nodes SNT, SNB) will be patterned to form conductors that overlie the structure, making contact to active regions 54 or gate elements 56 (or both) via respective contact openings 58. More specifically, metal conductors serving as signal conductors will physically contact active regions 54 defining bit lines $BLT_k$, $BLB_k$, and storage nodes SNT, SNB. Signal conductors will also physically contact gate structures 56 serving as storage nodes SNT, SNB, and word line $WL_j$. Metal conductors serving as bias conductors will contact active regions 54 to apply power supply voltage $V_{dda}$ and ground voltage $V_{ssa}$.

FIG. 7b also illustrates the outline of the various transistors 33, 34, 35 within cell $30_{jk}$, corresponding to the electrical schematic of FIG. 7a. As is fundamental in the art, MOS transistors are located at regions of the surface at which a gate element 56 overlies an instance of active region 54. It is contemplated that those skilled in the art will be able to follow the schematic of FIG. 7a within the layout of FIG. 7b with reference to the identification of transistors 33, 34, 35 in FIG. 7a. For example, the metal conductor schematically shown as storage node SNB connects active region 54 at the drain of transistor 34b and one side of pass transistor 35b to active region 54 at the drain of transistor 33b and to gate element 56 serving as the gate of transistors 33a, 34a (via a shared contact opening 58). Similarly, the metal conductor schematically shown as storage node SNT connects active region 54 between transistors 34a, 35a to active region 54 at the drain of transistor 33a, and (via shared contact opening 58) to gate element 56 serving as the gates of transistors 33b, 34b. Power supply and ground voltages $V_{dda}$, $V_{ssa}$, and bit lines $BLT_k$, $BLB_k$, and word line $WL_j$ are connected, via metal conductors (not shown) and contact openings 58 to the appropriate elements within cell $30_{jk}$ as shown in FIG. 7b, according to the electrical schematic of FIG. 7a.

As described above, n-channel transistors 34a, 35a, and transistors 34b, 35b of cell $30_{jk}$ are formed in p-type regions 52. Similarly, p-channel transistors 33a, 33b are formed in n-well 55.

Figure 6B:
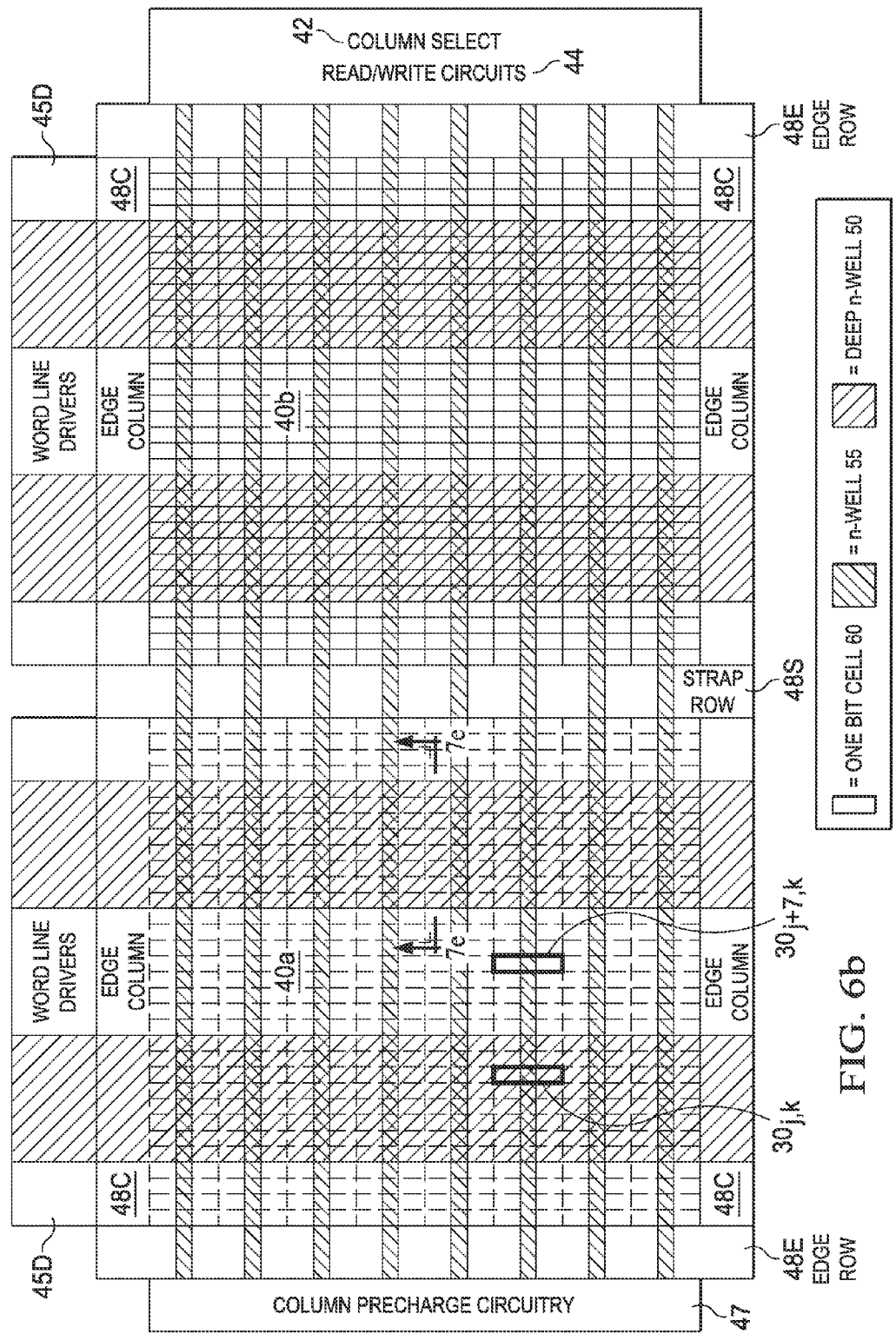

Referring now to FIG. 6b, and according to embodiments of this invention, multiple deep n-well regions 50 are formed in the memory cell array area of integrated circuit 25. In this regard, FIG. 6b illustrates the locations of n-wells 55 and deep n-wells 50 in the layout of FIG. 6a, according to an embodiment of the invention. These deep n-well regions 50 may be formed in the conventional manner for "diffusion-under-field" (or "DUF") structures in integrated circuits, such as by way of a masked ion implant of sufficient dose and energy to place the dopant ions at the desired depth, followed by an anneal to diffuse the implanted dopant as desired. Other methods for forming such buried doped regions, such as used in conventional bipolar manufacturing flows, may alternatively be used to form deep n-wells 50.

According to embodiments of this invention, each deep n-well 50 is separated on its sides by p-type material, for example portions of the p-type substrate 51. In some embodiments, such as that shown in FIG. 6b, deep n-wells 50 extend parallel to one another beneath the surface of the memory cell array area, for example at a relatively constant spacing relative to one another. This construction results in a two-dimensional grid of n-type semiconductor material at a common potential, with reduced parasitic resistance at any given node in the n-well grid and with increased junction capacitance, both of which improve the robustness of the device to SEU and latchup events. Because the deep n-well regions are separated from one another by p-type semiconductor material, for example the substrate and p-type surface regions or p-wells, that p-type material is also effectively arranged in a two-dimensional grid, further reducing parasitic resistance and increasing junction capacitance, and further improving the robustness of the device to SEU and latchup events.

Of course, the conductivity types of the wells, deep wells, and substrate structures may be reversed (e.g., with p-type wells contacting deep p-well regions, both formed into an n-type substrate) if desired.

In this embodiment, eight instances of n-wells 55 extend in the column (horizontal in this view) direction from edge row 48E on the left side of array block 40a, across strap row 48S, and across array block 40b to edge row 48E. In this layout, as described above in connection with FIG. 6b, a center portion of each bit cell 60, within which its p-channel load transistors 33a, 33b are formed, is disposed within an instance of n-well 55. In this example, each n-well 55 extends along a column of bit cells 60 across array blocks 40a, 40b, edge rows 48E, edge columns 48C, and strap row 48S. N-wells 55 may also extend into the peripheral circuitry of column precharge circuitry 47, column select 42, and read/write circuits 44; alternatively, separate n-well instances (not shown) may be formed in those peripheral circuits. Also in this embodiment, two instances of deep n-wells 50 extend in the row (vertical in this view) direction across each of array blocks 40a, 40b, perpendicularly to n-wells 55. In this example, each deep n-well 50 has a width of eight bit cells 60 (i.e., eight rows wide), and is separated from its neighboring deep n-well within one of array blocks 40a, 40b by the width of eight bit cells 60 (i.e., eight rows). In this example, deep n-wells 50 also extend into edge columns 48C on the top and bottom of array blocks 40a, 40b in the view of FIG. 6b, and also extend into the peripheral circuitry of word line drivers 45D, although this extension of deep n-wells 50 beyond array blocks 40a, 40b is optional. For larger array blocks, containing more than the thirty-two rows shown in this example, it is contemplated that the spacing of deep n-wells 50 will typically be constant to maintain a uniform resistance profile over that region, although this constant spacing need not necessarily be followed.

As shown in FIG. 7d, each n-well 55 contacts deep n-well 50 at those locations at which the two cross one another. Considering this contact between n-wells 55 and deep n-wells 50, it is apparent that memory cell array 40 in the layout of FIG. 6b has a two-dimensional grid of n-type semiconductor material. In some embodiments, including the example of FIG. 6b, bias conductors make contact to n-wells 55 in edge rows 48E and strap row 48S (i.e., the well-tie regions). In such a construction, the two-dimensional grid of n-wells 55 and deep n-wells 50 is biased to a common potential (e.g., power supply voltage $V_{dda}$). This is typically realized by a bias conductor receiving power supply voltage $V_{dda}$ would contact an instance of n+ active region 54 disposed within n-well 55 at those locations, to make a well-tie contact.

If deep n-wells 50 extend into peripheral circuitry to array blocks 40a, 40b (e.g., word line drivers 45D, column precharge circuitry 47, column select 42, and read/write circuits 44), separate n-well instances (not shown) in those peripheral circuits can similarly make contact to deep n-wells 50, allowing bias conductors contacting those peripheral n-wells to bias the two-dimensional grid of deep n-wells 50 and n-wells 55. In this case, this peripheral circuitry can serve as the well-tie regions for n-wells 55 within array blocks 40a, 40b, eliminating the need for well contacts to be made within edge columns 48C. Depending on the desired spacing of well contacts and the size of memory cell array 40, this bias from peripheral circuitry may also allow construction of memory cell array 40 without strap row 48S.

In the layout of FIG. 6b, the portions of array blocks 40a, 40b that are not within n-wells 55 are within a p-type region 52. Accordingly, contiguous p-type regions 52 also extend in the column (i.e., horizontal) direction across array blocks 40a, 40b, edge rows 48E, and strap row 48S, between n-wells 55. Each of these p-type regions 52 thus have portions overlying deep n-wells 50, and portions that do not overlie deep n-wells 50. In this embodiment, therefore, a two-dimensional grid of p-type semiconductor material is present, formed by p-type regions 52 and the p-type substrate with which p-type regions 52 are contiguous at those locations between deep n-wells 50. In some embodiments, including the layout shown in FIG. 6b, bias conductors make contact to p-type regions 52 in edge rows 48E, edge columns 48C, and strap row 48S (i.e., the well-tie regions), allowing this two-dimensional grid of p-type material to be biased to a common potential (e.g., ground $V_{ssa}$). These well-tie contacts are typically realized by bias conductors at ground voltage $V_{ssa}$ contacting p+ active regions 54 within p-type region 52 at those locations.

FIG. 7d illustrates, in cross-section, the construction of a portion of memory cell array 40 in integrated circuit 25 at which SRAM cell $30_{j,k}$ is realized, at a location overlying an instance of deep n-well 50 formed within p-type substrate 51, as shown in FIG. 6b. As such, the particular n-well in which p-channel transistors in SRAM cell $30_{j,k}$ are formed extends from the surface of the structure to a depth that contacts deep n-well 50. By extending to deep n-well 50, n-type silicon effectively surrounds islands of p-type substrate 51 in this cross-section, defining p-type regions 52 as shown in FIG. 7d. In this embodiment, the p-type dopant concentration in these p-type regions 52 is essentially the same as p-type substrate 51 in this embodiment of the invention, as p-type regions 52 are portions of substrate 51 that, where overlying an instance of deep n-well 50, are "walled-off" by deep n-well 50 and n-wells 55.

FIG. 7e shows a cross-section of a portion of array block 40a in the perpendicular direction from that of FIG. 7d, but over a number of bit cells 60. Active regions 54 and gate electrodes 56 (not to scale) corresponding to structures in a number of bit cells 60 are shown as a point of reference. As shown in this view, p-type region 52 extends beyond the width of this instance of deep n-well 50, connecting to substrate 51 at those locations beyond deep n-well 50. As a result, each p-type region 52 has a portion overlying each instance of deep n-well 50 within its array block 40a, 40b, and a portion that does not overlie an instance of deep n-well 50, which are instead contiguous with substrate 51. Accordingly, p-type regions 52 within each array block 40a, 40b are interconnected with one another via substrate 51, forming a two-dimensional grid of p-type semiconductor material.

According to embodiments of the invention, deep n-wells 50 need not be formed over the entire chip area of integrated circuit 25. However, if it is desired to make a well contact to n-wells 55 and deep n-wells 50 of array blocks 40a, 40b by bias conductors routed within in the area at which peripheral circuits (i.e., decoders, sense amplifiers, write circuits, precharge circuits, etc.) bias are realized, then one or more deep n-wells 50 may be implemented or extended to make contact to one or more n-wells realized in those peripheral circuits. Similarly, bias to p-type regions 52 may be applied at bias contacts to p-type regions within the peripheral circuits, with that bias conducted to array blocks 40a, 40b via substrate 51.

Figure 7F:
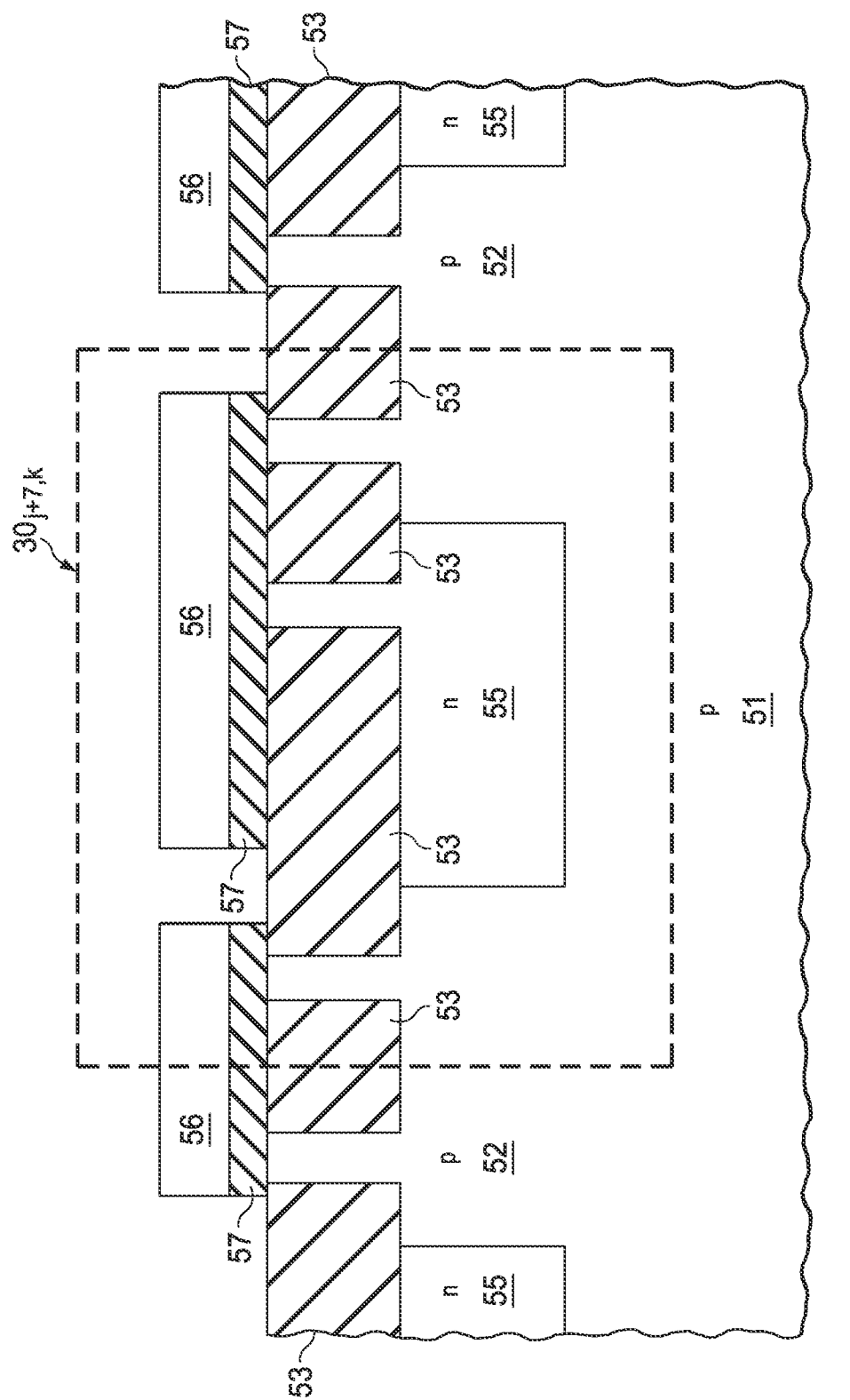

FIG. 7f illustrates, in cross-section, the construction of SRAM cell $30_{j+7,k}$, the location of which in array block 40a is shown in FIG. 6b. SRAM cell $30_{j+7,k}$ is constructed similarly as SRAM cell $30_{j,k}$ shown in FIG. 7c, except that this location of memory cell array 40 does not overlie an instance of deep n-well 50. As such, p-type regions 52 are contiguous with underlying p-type substrate 51, and thus can be maintained at the same potential. This contiguous connection with p-type substrate 51 will also be present in the case in which p-type regions 52 are implanted p-wells, of course with a dopant gradient between the well and substrate depending on the difference in dopant concentration.

Of course, the construction of memory cell array 40 shown in FIGS. 6a and 6b, and FIGS. 7a through 7f, is presented by way of example only, it being understood that the particular layout of SRAM cells 30 and memory cell array 40 can vary from that shown, depending on the particular manufacturing technology and design rules applicable to each implementation, and on the layout optimization arrived at by those skilled in that art.

Figure 8:
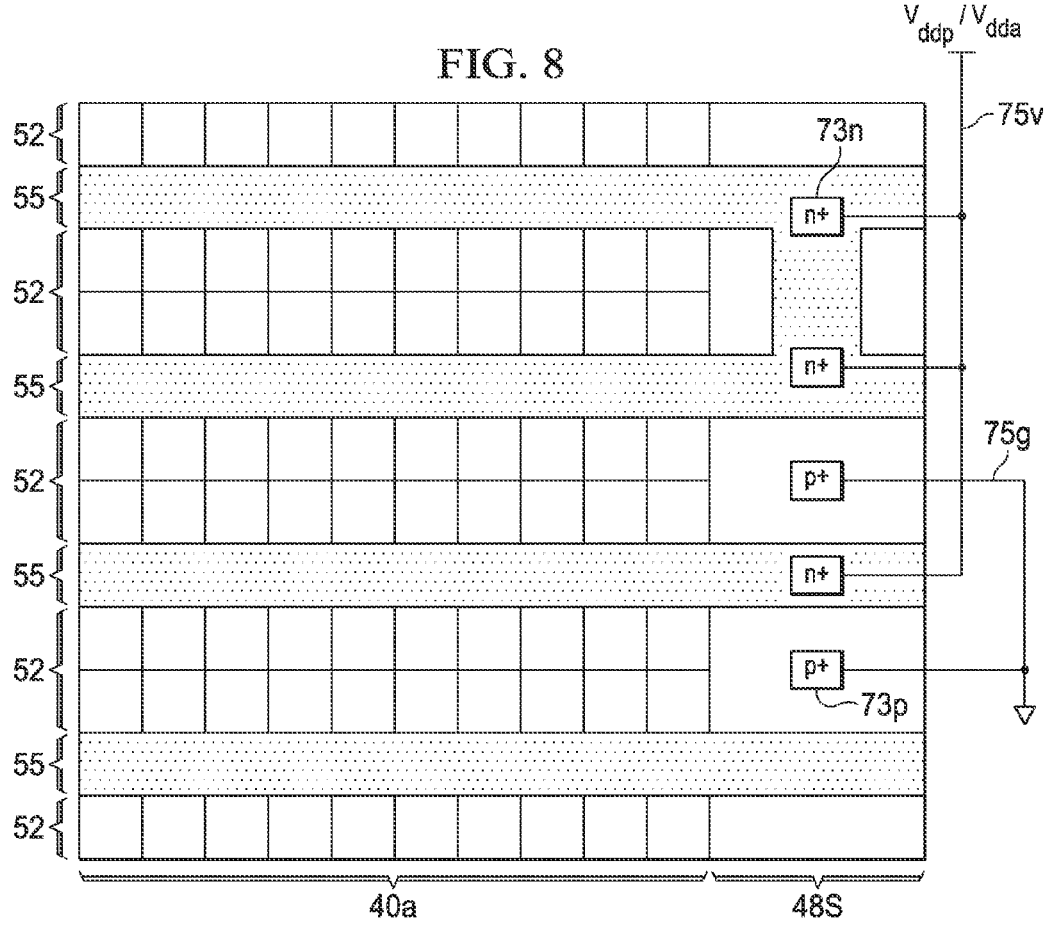
FIG. 8 is a plan view of a portion of an integrated circuit according to an embodiment of the invention.

As mentioned above, in those embodiments in which a bias voltage is to be applied to n-wells 55 and p-type regions 52, the appropriate well-tie contacts can be made in edge rows 48E and strap row 48S, each adjacent to the rows and columns of bit cells 60. FIG. 8 illustrates, in plan view, a portion of the layout of strap row 48S in the middle of memory cell array 40. As shown in the simplified example of FIG. 8, instances of n-wells 55 extend beyond the bounds of the area of array block 40a. In some cases, as shown in FIG. 8, multiple instances of n-wells 55 connect with one another within strap row 48S, at which n+ well contact regions 73n are provided. Alternatively, individual instances of n-wells 55 may support their own n+ contact region 73n, also as shown in FIG. 8. One or more bias conductors 75v physically contact these n+ well contact regions 73n in the conventional fashion, and thus bias n-wells 55 to the desired well bias voltage, for example the same voltage as that biasing cells 30 in memory cell array 40, namely power supply voltage $V_{dda}$. If p-type regions (or wells) 52 are to receive a bias voltage, p+ contact regions 73p are located in extended portions of p-type regions 52 within strap row 48S, and are to be physically contacted by one or more bias conductors 75g carrying the desired bias voltage, such as ground $V_{ssa}$. In each case, the construction of memory cell array 40 described above, including multiple instances of deep n-well regions 50 separated by p-type substrate 51, allows the bias voltages applied by bias conductors 75v, 75g to be applied throughout the array.

Deep n-well regions 50 need not extend into strap row 48S in order for this applied bias to be carried throughout array blocks 40a, 40b, but may so extend into strap row 48S if desired.

It is of course contemplated that the actual layout of strap row 48S, as well as edge rows 48E at which similar well contact is made, can vary significantly from the simplified illustration of FIG. 8. As mentioned above, it is contemplated that strap row 48S and edge rows 48E may include structures similar to those of bit cells 60, to maintain photolithographic regularity. It is contemplated that those skilled in the art having reference to this specification will be readily able to incorporate the appropriate contact regions 73n, 73p within strap rows 48S and edge rows 48E in a manner suited for particular implementations.

As discussed above, alternatively or in addition to those in strap row 48S and edge rows 48E, the well contacts may be made in physical area at which peripheral circuitry for memory cell array 40 is realized, such as within row decoder and word line drivers 45, column select circuitry 42 or read/write circuits 44, and the like. Of course, to accomplish the appropriate well contact in those regions of integrated circuit 25, instances of n-wells 55 and p-type regions 52 within array blocks 40a, 40b will extend into the area occupied by those peripheral circuits, or separate n-wells in contact with deep n-wells 50 may be formed in those peripheral circuit areas. Deep n-wells 50 may also extend into those regions, for example as shown in FIG. 6b. In such an arrangement, if the peripheral circuitry is biased by a different power supply voltage, or from a different ground line, those voltages may be applied to n-wells 55 and p-type regions 52 if desired.

Alternatively, as described in copending and commonly assigned application Ser. No. 13/558,003, incorporated herein by reference, either or both of p-type regions 52 and n-wells 55 may be allowed to electrically float (i.e., not have a bias voltage applied thereto), if desired. It is contemplated, however, that even in this case, the interconnection of the n-type and p-type regions within array blocks 40a, 40b will provide improved robustness of integrated circuit 25 to latchup and SEU due to the increased junction capacitance provided by the two-dimensional grids.

In addition to the improved robustness to latchup and SEU events, it is contemplated that the interconnected n-type structure of n-wells 55 with deep n-well regions 50, and also the interconnected p-type structure of p-type regions (or wells) 52 and substrate 51, can each serve as a plate of a distributed decoupling capacitor. Particularly in its application to memory cell array 40 as described above, this decoupling capacitor can assist in reducing voltage transients, such as may occur upon the switching of array blocks 40a, 40b into and out of an "RTA" (retain-till-accessed) state in which power supply voltage $V_{dda}$ is reduced during stand-by or idle periods.

Figure 9:
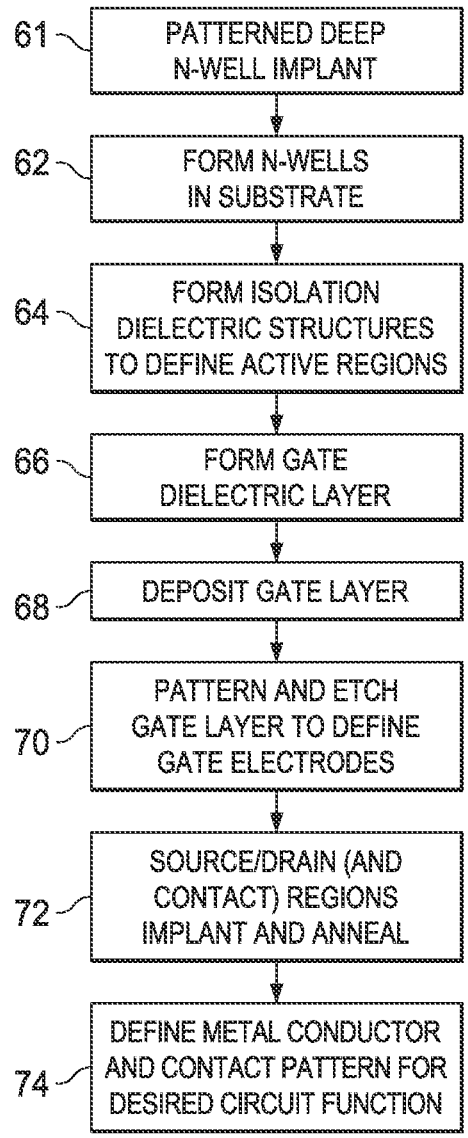
FIG. 9 is a flow diagram illustrating a manufacturing process flow for fabricating an integrated circuit according to embodiments of the invention.

Referring now to FIG. 9, a generalized manufacturing process flow for the fabrication of integrated circuit 25 including memory cell array 40 for the example of a CMOS manufacturing technology. Of course, variations in the construction of integrated circuit 25, including additional or different process steps and different orders of performing those processes, will be known to those skilled in the art having reference to this specification, and are contemplated to be within the scope of this invention as claimed.

In this example, actual physical fabrication of the integrated circuit begins with the formation of the various wells in substrate 51 of a single-crystal silicon wafer of the desired conductivity type and dopant concentration, of a single-crystal layer of silicon overlying an insulator layer disposed on a handle wafer (according to conventional silicon-on-insulator technology), or of an alternative starting material to these typical substrate structures. In process 61, a masked deep n-well ion implant is performed to define and form deep n-well regions 50 across array blocks 40a, 40b. In this process 61, the appropriate donor species (e.g., phosphorous) is implanted at the appropriate dose and energy, at the desired locations as defined by patterned photoresist or another masking material, as known in the art, to deep n-well regions 50.

In process 62, n-wells 55 are defined in the conventional manner at selected locations of the surface of substrate 51, again by way of a masked ion implant. If a twin-well process is to be used, p-type wells 52 would be similarly formed, by way of a masked ion implant to locations at which n-wells 55 were not formed. In process 64, isolation dielectric structures 53 are formed at selected locations of the surface of substrate 51 and its wells 52, 55. In modern integrated circuits, these isolation dielectric structures 53 are formed using shallow trench isolation techniques; alternatively, local oxidation of silicon (LOCOS) isolation oxide can be thermally formed. As known in the art, those "moat" locations of the surface of substrate 51 and its wells 52, 55 at which isolation dielectric structures 53 are not formed will become the active regions at which transistors will eventually be formed.

In process 66, gate dielectric layer 57 is formed over the active regions defined by isolation dielectric structures 53. This gate dielectric layer may be silicon dioxide, formed by thermal oxidation of the exposed silicon in these active regions or by deposition, deposited silicon nitride, a combination or stack of silicon dioxide and silicon nitride, or such other transistor gate dielectric material as known in the MOS transistor art. For example, as described above, embodiments of this invention are especially well-suited for use in memories constructed according to a high-k, metal-gate technology, in which case gate dielectric layer 57 is constructed from a high-k material such as $HfO_2$. Gate layer 56 is then deposited overall, in process 68, and consists of the desired polysilicon or metal material from which gate electrodes and gate-level interconnects are defined at the desired locations by photolithographic pattern and etch process 70, according to the appropriate technology (e.g., including resolution enhancement technology, sub-resolution assist photomask features, etc.).

Ion implant and anneal process 72 is then performed to form heavily-doped source and drain regions for transistors, and doped regions for well contacts, of both conductivity types in this CMOS manufacturing process. As typical in the art, the implant forming source/drain regions is performed in a self-aligned manner relative to gate electrodes 56 defined in processes 68, 70. Lightly-doped drain extensions may be formed within process 72, in the conventional manner by forming sidewall dielectric spacers following a first source/drain implant, as is well-known. As described above, source and drain regions are formed by heavily-doped regions of a conductivity type opposite to that of the substrate or well at which those regions are formed, while well contacts are formed by heavily-doped regions of the same conductivity type as the substrate or well at which they are formed. According to embodiments of this invention, these well contacts are provided within strap rows 48S, edge rows 48E, edge columns 48C, or within peripheral circuitry, as described above.

In this example of the fabrication of integrated circuit 25, as shown in FIG. 9, conventional additional processing is then performed after formation of the gate level conductors in process 74. This process 74 specifically includes the formation of contact openings through overlying insulator layers to contact the source and drain regions, and gate electrodes, of transistors within memory cell array 40 and elsewhere in integrated circuit 25, and to contact n-well and p-well structures outside of the bounds of memory cell array 40. Process 74 also includes the deposition and patterning of the desired metal conductor routing into those contact openings. Other processes useful in the fabrication of actual integrated circuits, as known in the art, will be performed at the appropriate stages in this fabrication flow, as known by those skilled in the art having reference to this specification, such other processes culminating in the electrical test and packaging of integrate circuit 25 for use in its desired end system.

Embodiments of this invention provide an integrated circuit including a memory cell array, and methods of operating and fabricating the same, in which vulnerability of soft or hard failures due to latchup or SEU is substantially reduced. This improved robustness can be attained without significantly affecting the electrical performance of transistors in the memory cells of that array. In addition, because of the improved interconnection of n-type and p-type semiconductor material in the memory cell array, it is contemplated that the spacing of well contact areas (e.g., strap rows) can be increased from that of conventional memory cell array architectures, without degrading SEU and latchup tolerance. Embodiments of this invention can also provide the beneficial by-product of a distributed decoupling capacitor that improves latchup tolerance of the resulting integrated circuit.

While this invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A solid-state memory in an integrated circuit formed at a semiconducting surface of a body, the memory comprising:
    a plurality of memory cells arranged in rows and columns within a generally rectangular memory cell array area of the surface, each memory cell including a first transistor having a channel region disposed in a first well region of the surface doped to a first conductivity type, and a second transistor having a channel region disposed in a second conductivity type region of the surface; and
    a plurality of deep well regions of the first conductivity type disposed within the body and in contact with the first well region at locations below the surface of the memory cell array area;
    wherein the second conductivity type region includes a portion within the memory cell array area overlying one of the plurality of deep well regions, and a portion within the memory cell array area not overlying any of the plurality of deep well regions.

2. The memory of claim 1, wherein the memory includes a plurality of first well regions disposed in the memory cell array area, each of the plurality of first well regions in contact with one or more of the plurality of deep well regions;
    and wherein the memory includes a plurality of second conductivity type regions, each disposed between a pair of the first well regions within the memory cell array area.

3. The memory of claim 2, wherein the plurality of deep well regions extend in a first direction relative to the memory cell array area at locations spaced apart from one another in a second direction perpendicular to the first direction;
    and wherein the plurality of first well regions extend across the surface in the second direction, spaced apart from one another in the first direction by one of the second conductivity type regions.

4. The memory of claim 2, further comprising:
    bias conductors, one or more of which physically contact one of the first well regions, and one or more of which physically contacts one of the second conductivity type regions.

5. The memory of claim 4, further comprising:
    peripheral circuitry disposed in a peripheral area outside of the memory cell array area;
    a peripheral first well region of the first conductivity type having at least a portion disposed in the peripheral area, the peripheral first well region in contact with at least one of the deep well regions;
    and wherein one or more of the bias conductors physically contacts the peripheral first well region in the peripheral area.

6. The memory of claim 5, wherein at least one of the plurality of deep well regions extend into the peripheral area; and wherein the peripheral first well region is in contact with the one of the plurality of deep well regions in the peripheral area.

7. The memory of claim 1, wherein the body comprises single-crystal silicon doped to the second conductivity type;
    and wherein the second conductivity type regions each comprise a surface portion of the body.

8. The integrated circuit of claim 1, wherein the body comprises single-crystal silicon doped to the second conductivity type;
    and wherein the second conductivity type regions each comprise one of a plurality of second well regions of the second conductivity type disposed at the surface in the memory cell array area at locations spaced apart from one another and separated from one another by one of the first well regions, each of the second well regions contacting portions of the body of the second conductivity type disposed between the deep well regions.

9. The memory of claim 1, wherein the first conductivity type is n-type and the second conductivity type is p-type.

10. The memory of claim 9, wherein the body comprises a p-type substrate.

11. An integrated circuit formed at a semiconducting surface of a body, comprising:
    a plurality of deep well regions of a first conductivity type disposed beneath a memory cell array area of the surface, the deep well regions extending parallel to one another in a first direction, at locations separated from one another by portions of the body of a second conductivity type;
    a plurality of first well regions of the first conductivity type disposed at the surface in the memory cell array portion, the first well regions extending parallel to one another in a second direction perpendicular to the first direction, at locations spaced apart from one another in the first direction and separated from one another by second conductivity type regions of the surface, each of the first well regions contacting each of the deep well regions; and
    a plurality of memory cells arranged in rows and columns within the memory cell array portion of the surface, each memory cell including a first transistor having a channel region disposed in one of the first well regions, and a second transistor having a channel region disposed in one of the second conductivity type regions of the surface.

12. The integrated circuit of claim 11, further comprising:
    a plurality of bias conductors, one or more of which is physically contacting at least one of the first well regions.

13. The integrated circuit of claim 11, wherein the body comprises single-crystal silicon doped to the second conductivity type;
    and wherein the regions of the second conductivity type comprise portions of the body extending to the surface.

14. The integrated circuit of claim 11, wherein the body comprises single-crystal silicon doped to the second conductivity type;
    and wherein the second conductivity type regions comprise a plurality of second well regions of the second conductivity type disposed at the surface in the memory cell array portion, the second well regions extending parallel to one another in the second direction, at locations spaced apart from one another in the first direction and separated from one another by the first well regions, each of the second well regions contacting portions of the body of the second conductivity type disposed between the deep well regions.

\* \* \* \* \*